United States Patent
Nakano et al.

(10) Patent No.: US 7,570,919 B2
(45) Date of Patent: Aug. 4, 2009

(54) TRANSMITTER, RECEIVER, AND RADIO COMMUNICATIONS SYSTEM AND METHOD

(75) Inventors: Hiroshi Nakano, Yamanashi (JP); Yasutake Hirachi, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 979 days.

(21) Appl. No.: 10/011,763

(22) Filed: Dec. 11, 2001

(65) Prior Publication Data

US 2002/0102951 A1 Aug. 1, 2002

(30) Foreign Application Priority Data

Dec. 13, 2000 (JP) ............................ 2000-378810
Sep. 19, 2001 (JP) ............................ 2001-284575

(51) Int. Cl.
*H04B 1/00* (2006.01)
*H04B 7/00* (2006.01)
*H01Q 11/12* (2006.01)

(52) U.S. Cl. ............................ 455/42; 455/71; 455/118

(58) Field of Classification Search ................. 455/42, 455/118, 120, 39, 101, 102, 103, 104, 71, 455/46, 60
See application file for complete search history.

(56) References Cited

U.S. PATENT DOCUMENTS

| | | | |
|---|---|---|---|
| 4,898,505 A | 2/1990 | Froehlich | |
| 5,176,481 A | 1/1993 | Schiefer | |
| 5,355,523 A | 10/1994 | Ogawa et al. | |
| 5,355,524 A | 10/1994 | Higgins, Jr. | ............... 455/82 |
| 5,419,664 A | 5/1995 | Hengesbach | |
| 5,450,454 A * | 9/1995 | Johansson | ............. 375/133 |
| 5,787,362 A * | 7/1998 | Matero | ............... 455/553.1 |
| 6,973,328 B1 * | 12/2005 | Suematsu | ............. 455/552.1 |

FOREIGN PATENT DOCUMENTS

| | | |
|---|---|---|
| EP | 0 346 922 A | 12/1989 |
| JP | 4-274628 | 9/1992 |
| JP | 05-048491 | 2/1993 |
| JP | 11-004118 | 1/1999 |

OTHER PUBLICATIONS

Patent Abstract of Japan, Publication No. 11004118, dated Jan. 6, 199.
Y. Shoji et al.; The Institute of Electronics, Information and Communication Engineers, (IEICE), Communication Society Conference, B-5-135, 1999.
"Millimeter-wave communications system using self-heterodyne detection scheme," Shoji et al, Inst.EICE (Communication Soc. Conf. 1999) p. 370 and Full English Translation.

(Continued)

*Primary Examiner*—Eugene Yun
(74) *Attorney, Agent, or Firm*—Westerman, Hattori, Daniels & Adrian, LLP.

(57) ABSTRACT

Transmitter and receiver for wireless communications with improved accuracy and stability in radio frequency control. A transmitter mixes an information-carrying signal (first signal) and a non-modulated wave signal (second signal) with a carrier signal, thereby producing a first and second radio frequency signals for radio wave transmission. A receiver mixes those two radio frequency signals to extract the original information signal. While the received radio frequency signals contain some frequency fluctuations and phase noises that have been introduced at the sending end, such unstable components $\Delta f$ will cancel out at the receiving end.

59 Claims, 17 Drawing Sheets

OTHER PUBLICATIONS

Japanese Patent Application Laid-open Publication No. 01-235424 A—Sep. 20, 1989—English Abstract.
Japanese Patent Application laid-open Publication No. 63-151123 A—Jun. 23, 1988—English Abstract.

Office Action from Japanese Patent Office in corresponding Japanese patent application No. 2001-284575, issued Sep. 27, 2005.
Patent Abstracts of Japan, vol. 1999, No. 10, Aug. 31, 1999 & JP 11 129659A (Konica Corp), May 18, 1999 abstract.

* cited by examiner

TRANSMITTER, RECEIVER, AND RADIO COMMUNICATIONS SYSTEM AND METHOD

BACKGROUND OF THE INVENTION

1. Field of the Invention

The present invention relates to a transmitter, receiver, and radio communications system and method. More particularly, the present invention relates to a transmitter, receiver, and radio communications system and method with radio frequency control mechanisms.

2. Description of the Related Art

Recent years have seen a rapid increase in demands for mobile communication services including cellular phones systems. In our highly developed information age society, radio communication technologies have become more and more important. While such systems use radio waves with very high frequencies, most radio communication devices are designed basically to process signals with lower frequencies because they are easier to handle.

In a typical radio transmitter, a given information signal modulates an intermediate frequency (IF) signal, and this modulated IF signal is up-converted to a radio frequency (RF) signal through a mixing process with a high frequency signal supplied from a local oscillator. The resultant radio frequency signal is then radiated into the air from a transmitter antenna. At the receiving end, the incoming radio frequency signal is received with a receiver antenna. By mixing it with its own local oscillator signal, the receiver down-converts the signal to the intermediate frequency again. Note here that the same local oscillator frequency has to be used at both ends, so that the receiving party can reproduce the original information signal correctly.

FIG. 17 shows a conventional radio communications system. This radio communications system 300 includes a transmitter 600 and a receiver 700. The transmitter 600 has a mixer 601, a local oscillator 602, an amplifier 603, and an antenna 604. The receiver 700 has an antenna 704, an amplifier 703, a mixer 701, and a local oscillator 702.

Referring to the transmitter 600, the mixer 601 receives a signal $IF_{in}$ having an intermediate frequency of $f_{IF}$, which is modulated with an information signal. It also receives a local oscillator signal Loa with a frequency of $f_L$ from the local oscillator 602. The multiplication of these two input signals yields a transmission signal with a radio frequency of $f_{RF}$, where $f_{RF}=f_{IF}+f_L$. This radio frequency signal is boosted by the amplifier 603 and radiated from the antenna 604 into the air.

Referring to the receiver 700, the antenna 704 catches the radio frequency signal sent from the transmitter 600, which is then supplied to the amplifier 703 for signal amplification. The mixer 701 combines the amplified RF signal with a local oscillator signal Lob with the same frequency $f_L$ as used in the transmitter 600, thereby yielding an output signal $If_{out}$. This output signal $If_{out}$ has the difference frequency $(f_{RF}-f_L)$ between the two signals being mixed, which should be the same intermediate frequency $f_{IF}$ as that in the transmitter 600 because $f_{RF}-f_L=(f_{IF}+f_L)-f_L=f_{IF}$.

In order to make the above system work properly, the intermediate frequency signal $IF_{out}$ reproduced by the receiver mixer 701 agrees with the original intermediate frequency signal $IF_{in}$ used in the transmitter 600. This means that the local oscillator in the receiver 700 must have the same frequency as that in the transmitter 600. In other words, the two local oscillator signal Loa and Lob generated by the two local oscillators 602 and 702 have to agree with each other in terms of the frequency. Normally, this requirement is fulfilled by employing a phase-locked loop (PLL) circuit that generates an accurate local oscillator signal with a high frequency stability and low phase noise.

Meanwhile, regarding the frequency usage for radio communications, the millimeter band (30-300 GHz) and frequencies slightly below that band (called "quasi millimeter band") are of great interest as a resource to serve the increasing user demand in recent years. These frequency bands have been little explored and are now considered to be particularly suitable for vehicle-to-vehicle communications such as Intelligent Transport Systems (ITS), or for sophisticated applications of radio communication technologies such as wireless LANs, because they do require a broader bandwidth to achieve high-speed data exchange. It should also be mentioned that millimeter-wave radio communications products targeted to general consumers have to be small and inexpensive.

The above-described conventional system 300 can operate properly in frequency ranges up to about 3 GHz, since it is relatively easy to design a stable local oscillator for those frequency ranges. However, the desired frequency range (i.e., millimeter band) is ten times or one hundred times as high as the operating range of conventional circuits. Because of the limited stability and accuracy of local oscillators, it is hard to upgrade the conventional transmitters and receivers for the purpose of millimeter-wave radio communication.

More technically, think of a voltage controlled oscillator (VCO) operating at frequencies over 30 GHz. This VCO must have an integrated PLL circuit to stabilize its output phase and frequency to the extent that is required in the millimeter band applications. However, it is difficult to provide such PLL circuits because they require a good divider and phase detector devices that can operate at extremely high frequencies. While millimeter wave applications require small, inexpensive, and accurate VCO devices, as mentioned above, none of the currently available components satisfy those requirements.

Another possible method to obtain a high frequency signal is to use frequency multipliers. With such devices, a stable oscillator signal in the order of a few GHz can be multiplied up to a designed frequency. However, the phase noise would also be multiplied to an intolerable level, causing communication errors in data transport.

SUMMARY OF THE INVENTION

In view of the foregoing, it is an object of the present invention to provide a transmitter and receiver which make accurate and stable radio communication possible.

It is another object of the present invention to provide a radio communications system which makes accurate and stable radio communication possible.

It is still another object of the present invention to provide a radio communication method which makes accurate and stable radio communication possible.

To accomplish the first object, according to the present invention, there is provided a transmitter comprising a transmitter mixer which produces a first and second radio frequency signals for radio wave transmission by mixing a first and second signals with a carrier signal. Here the first signal is an information-carrying modulated signal, and the second signal is a non-modulated wave signal.

Also, to accomplish the first object, according to the present invention, there is provided a receiver comprising a receiver mixer which mixes a received first and second radio frequency signals to extract a difference frequency signal therefrom. Here, the first and second radio frequency signals are produced at the sending end by mixing a first signal and a second signal with a carrier signal. The first signal is an information-carrying modulated signal, and the second signal is a non-modulated wave signal.

Further, to accomplish the second object, the present invention provides a radio communications system, comprising a transmitter with a transmitter mixer and a receiver with a receiver mixer. The transmitter mixer produces a first and second radio frequency signals for the purpose of radio wave transmission, by mixing a first and second signals with a carrier signal. The first signal is an information-carrying modulated signal, and the second signal is a non-modulated wave signal. The receiver mixer extracts a difference frequency signal from the first and second radio frequency signals by mixing the first and second radio frequency signals that are received from the transmitter.

Moreover, to accomplish the third object, the present invention provides a method of sending information from a transmitting end to a receiving end through a radio communication channel. This method comprises the steps of:

(a) at the transmitting end, sending a first and second radio frequency signals which are produced by mixing a first and second signals with a carrier signal, the first signal being modulated with an information signal, the second signal being a non-modulated wave signal; and (b) at the receiving end, extracting a difference frequency signal from the first and second radio frequency signals by mixing the first and second radio frequency signals that are received from the transmitting end.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Preferred embodiments of the present invention will be described below with reference to the accompanying drawings.

Figure 1A:
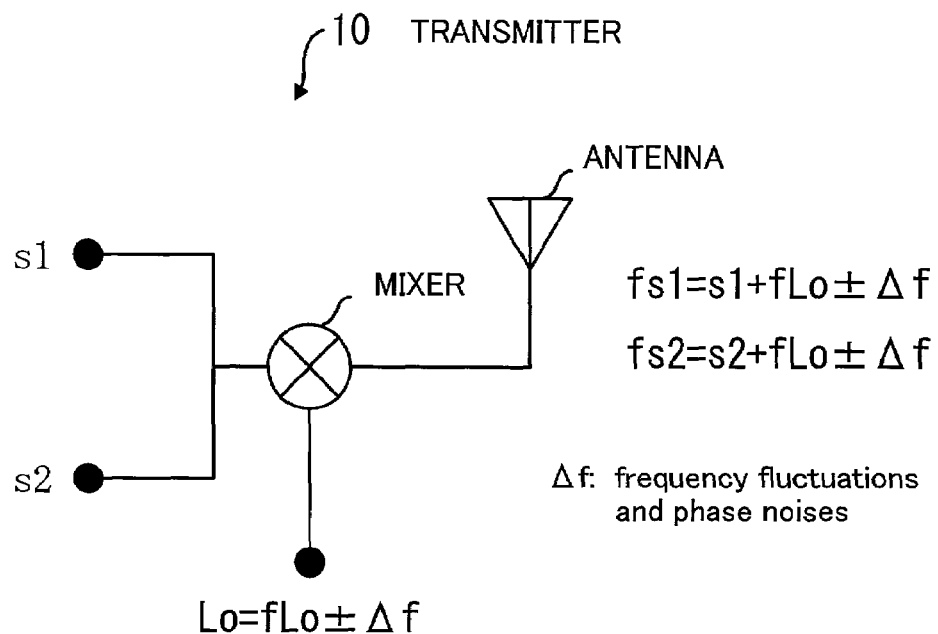
FIGS. 1(A) and 1(B) show the concept of the present invention, illustrating a transmitter in FIG. 1(A) and a receiver in FIG. 1(B)
Figure 1B:
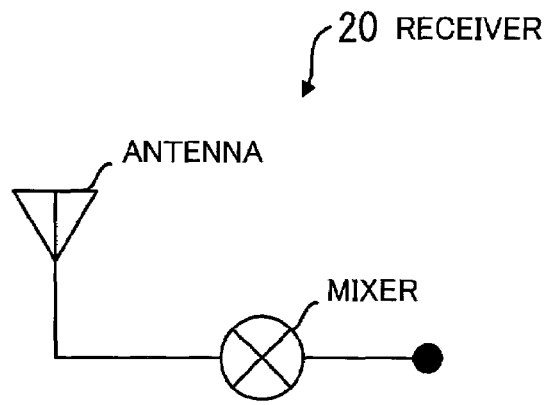

FIGS. 1(A) and 1(B) show the concept of the present invention, depicting a transmitter 10 in FIG. 1(A) and a receiver 20 in FIG. 1(B). According to the present invention, the transmitter 10 employs a mixer for mixing a first and second signals (s1 and s2) with a carrier signal (fLo), where the first signal S1 conveys substantive information, while the second signal s2 is a simple non-modulated wave. This mixing operation converts the first signal s1 and second signal s2 to first and second radio frequency signals (fs1 and fs2), respectively, which will readily be radiated into the air. Here, the term "mixing" refers to an operation of combining two different signals in a non-linear fashion, so as to produce a higher or lower frequency signal.

Each of the resultant radio frequency signals, however, contains some amount of frequency fluctuations and phase noises, which are collectively represented by the symbol Δf. While such unstable components Δf are introduced at the transmitting end, the present invention eliminates their undesired effect in radio signal reception, by mixing the two signal waves at the receiver 20. That is, Δf in the first radio frequency signal and the same in the second radio frequency signal will cancel each other out, in the course of a frequency mixing process at the receiving end.

FIG. 1(B) shows that the receiver 20 outputs a difference signal (s1-s2), not the desired information signal s1. It is not difficult, however, to recover the first signal s1 from this difference signal, because the second signal s2 is a known non-modulated wave which can be generated easily by an oscillator with that frequency.

The present invention proposes such a unique transmitter/receiver structure where a first signal (modulated) and a second signal (non-modulated) are mixed together with a carrier signal for radio transmission; and the receiver extracts the difference component by mixing the two up-converted radio signals. The receiving user can utilize the extracted difference signal as it is, since its apparent frequency shift (i.e., frequency of the second signal) is a known one. (Actually, there is another method to reproduce the first signal, other than the mixing of the first and second signals.)

Figure 2A:
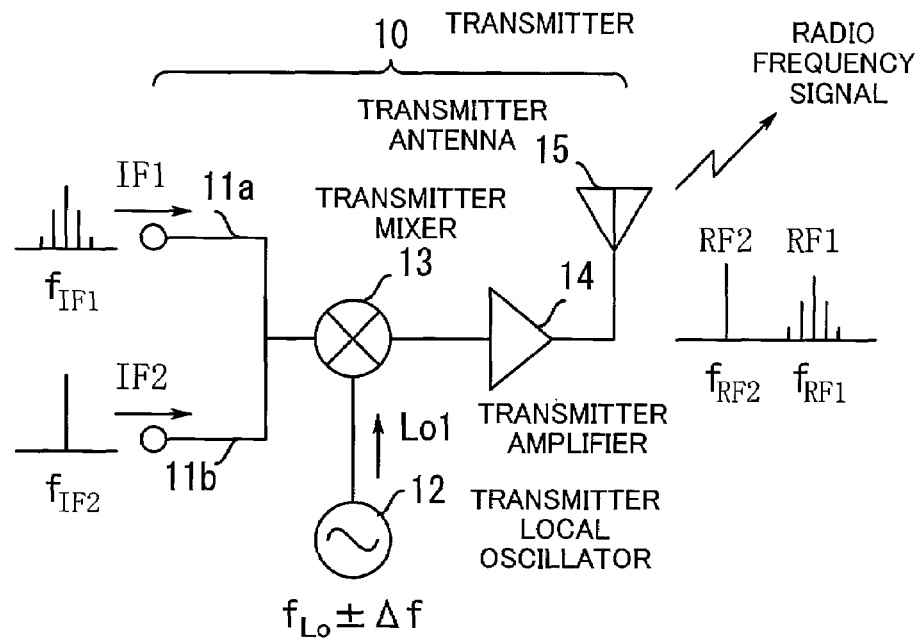
FIGS. 2(A) and 2(B) show the structure of a system according to the present invention, illustrating a transmitter in FIG. 2(A) and a receiver in FIG. 2(B)
Figure 2B:
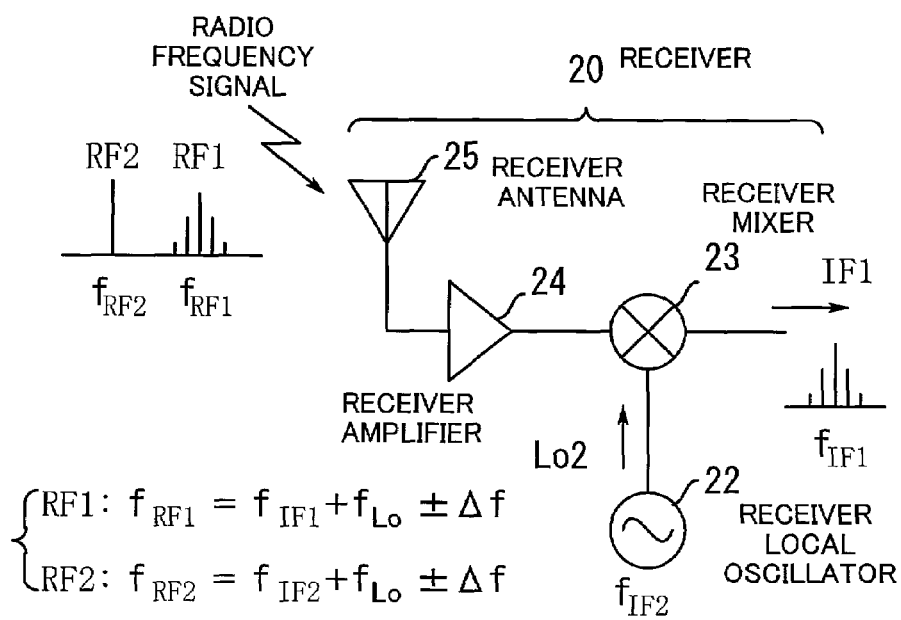

The structure and operation of the present invention will now be described in greater detail below. FIGS. 2(A) and 2(B) show the structure of a proposed radio communications system including a transmitter 10 and a receiver 20.

Referring first to FIG. 2(A), the transmitter 10 is composed of the following elements: a transmitter local oscillator 12, a transmitter mixer 13, a transmitter amplifier 14, and a transmitter antenna 15. Further, the transmitter 10 has a first input terminal 11a and a second input terminal 11b. The first input terminal 11a is used to receive a modulated signal IF1 with a first intermediate frequency $f_{IF1}$. On the other hand, the second input terminal 11b receives a sinusoidal wave signal IF2 with a second intermediate frequency $f_{IF2}$.

The transmitter local oscillator 12 generates a transmitter local oscillator signal Lo1. The transmitter mixer 13 combines the modulated signal IF1 and sinusoidal wave signal IF2 with the transmitter local oscillator signal Lo1, thereby up-converting the former two signals IF1 and IF2 into radio frequency signals RF1 (frequency $f_{RF1}$) and RF2 (frequency $f_{RF2}$), respectively. This up-converting operation will be discussed again, with reference to equations (1a) and (1b). The transmitter amplifier 14 amplifies the above radio frequency signals RF1 and RF2, causing the transmitter antenna 15 to radiate them into the air.

Referring next to FIG. 2(B), the receiver 20 is composed of a receiver local oscillator 22, a receiver mixer 23, a receiver amplifier 24, and a receiver antenna 25. The receiver antenna 25 catches the two radio waves RF1 and RF2 propagated from the transmitter 10. The received signals are supplied to the receiver amplifier 24 for preliminary amplification.

The receiver local oscillator 22 generates a receiver local oscillator signal Lo2 having the same frequency as the second intermediate frequency $f_{IF2}$ used in the transmitter 10. The receiver mixer 23 down-converts the amplified radio frequency signals RF1 and RF2 by mixing the receiver local oscillator signal Lo2 into them, thereby reproducing the modulated signal IF1 that carries the intended information.

While the above example has assumed that the first signal assumed is a modulated intermediate-frequency signal, it would also be possible to use a baseband signal as the first signal. Here, the term "baseband signal" refers to the original data signal before any encoding or modulation operations are performed on it.

The above-described transmitter and receiver will operate as follows. For illustrative purposes, it is supposed here that the present invention is applied to a millimeter wave radio communication system. That is, the transmitter employs a millimeter wave local oscillator to up-convert an information-carrying intermediate frequency signal into a millimeter-wave radio signal. The receiver reproduces the information.

The transmitter local oscillator 12 is an oscillator designed to generate a transmitter local oscillator signal Lo1 at a millimeter-band frequency ($f_{Lo}$). This oscillator 12, however, may not necessarily be stabilized with a phase-locked loop (PLL) or any other special circuit. The lack of stabilization means that the transmitter local oscillator signal Lo1 may exhibit a certain degree of instability. Let $\Delta f$ represent such frequency fluctuations and/or phase noises. A high-frequency oscillator with no special stabilization mechanism is likely to show this kind of unsteadiness, and therefore, its output frequency should be expressed as ($f_{Lo}\pm\Delta f$), taking its unstable frequency components into consideration.

The transmitter mixer 13 is a three-input one-output device. A modulated signal IF1 with a first intermediate frequency $f_{IF1}$ is supplied to the first input terminal 11a, while a sinusoidal wave signal IF2 with a second intermediate frequency $f_{IF2}$ is fed to the second input terminal 11b. The transmitter mixer 13 combines each input signal IF1 and IF2 with the transmitter local oscillator signal Lo1.

Theoretically, by mixing two different frequencies, two more different frequencies are produced; one is the sum of the two original frequencies, and the other is the difference between them. In the case of the transmitter mixer 13, the sum frequency component is extracted for use in radio transmission. That is, the transmitter mixer 13 outputs the following two radio band signals RF1 and RF2 with frequencies $f_{RF1}$ and $f_{RF2}$, respectively.

$$f_{RF1} = f_{IF1} + f_{LO} \pm \Delta f \quad (1a)$$

$$f_{RF2} = f_{IF2} + f_{LO} \pm \Delta f \quad (1b)$$

These signal RF1 and RF2 are amplified by the transmitter amplifier 14 and then fed to the transmitter antenna 15, causing radio waves to be sent out into the air. In reality, the spectrum of the radio frequency signals that the transmitter mixer 13 produces is a mixture of essential signals (i.e., RF1 and RF2) and non-essential spurious emissions (i.e., images of RF1 and RF2, and leakage of the local oscillator signal). The latter group of spectral components can be eliminated easily through the use of an appropriate bandpass filter, as will be discussed later in FIG. 5.

The receiver 20, on the other hand, receives the transmitted radio waves at its receiver antenna 25. The received signals RF1 and RF2 are amplified by the receiver amplifier 24 and supplied to the receiver mixer 23. The receiver local oscillator 22 produces a receiver local oscillator signal Lo2 having the same frequency $f_{IF2}$ as the sinusoidal wave signal IF2. Note that the proposed receiver 20 uses a lower frequency oscillator, instead of employing a millimeter-band local oscillator.

The receiver mixer 23 combines two incoming radio frequency signals RF1 and RF2 with the receiver local oscillator signal Lo2, thereby yielding a signal component with a frequency of ($f_{RF1}-f_{RF2}+f_{IF2}$). This expression can be rewritten as:

$$f_{RF1} - f_{RF2} + f_{IF2} = (f_{IF1} + f_{LO} \pm \Delta f) - (f_{IF2} + f_{LO} \pm \Delta f) + f_{IF2} \quad (2)$$

$$= f_{IF1} - f_{IF2} + f_{IF2}$$

$$= f_{IF1}$$

As obvious from the equation (2), the mixer output signal contains no fluctuating component $\Delta f$, which was included in the transmitter local oscillator signal Lo1 and could make the communication unstable. The equation (2) also tells us that the receiver mixer 23 outputs the information-carrying modulated signal IF1 only. This is because the receiver mixer 23 eliminates the second intermediate frequency components through its multiplication process with the receiver local oscillator signal Lo2 ($f_{IF2}$).

According to the above-described present invention, the radio communications system sends an additional IF signal for reference purposes, besides the information-carrying IF signal. This concept makes it easy to construct a millimeter band communications system, because it eliminates the need to seek a highly stable local oscillator, which is indeed unrealistic. The present invention simplifies the circuit structure, thus contributing to cost reduction of millimeter band radio equipment.

While the above explanation has assumed that the transmitter 10 has only one input terminal (i.e., the first input terminal 11a) to accept an information-carrying signal, the present invention should not be limited to this configuration. It is possible to add a plurality of similar terminals to input modulated signals to the transmitter mixer 13, thereby transmitting multiple information streams simultaneously. Suppose, for example, that the transmitter 10 has two instances of the first input terminal, 11a-1 and 11a-2 (not shown). A first modulated signal IF1-1 carrying voice information is supplied to one of the two input terminals, 11a-1, for example, and a second modulated signal IF1-2 containing image information to the other one 11a-2. The foregoing mixing operation is then applied to each of the two modulated signals IF1-1 and IF1-2, enabling different types of information to be transmitted at a time.

Figure 3A:
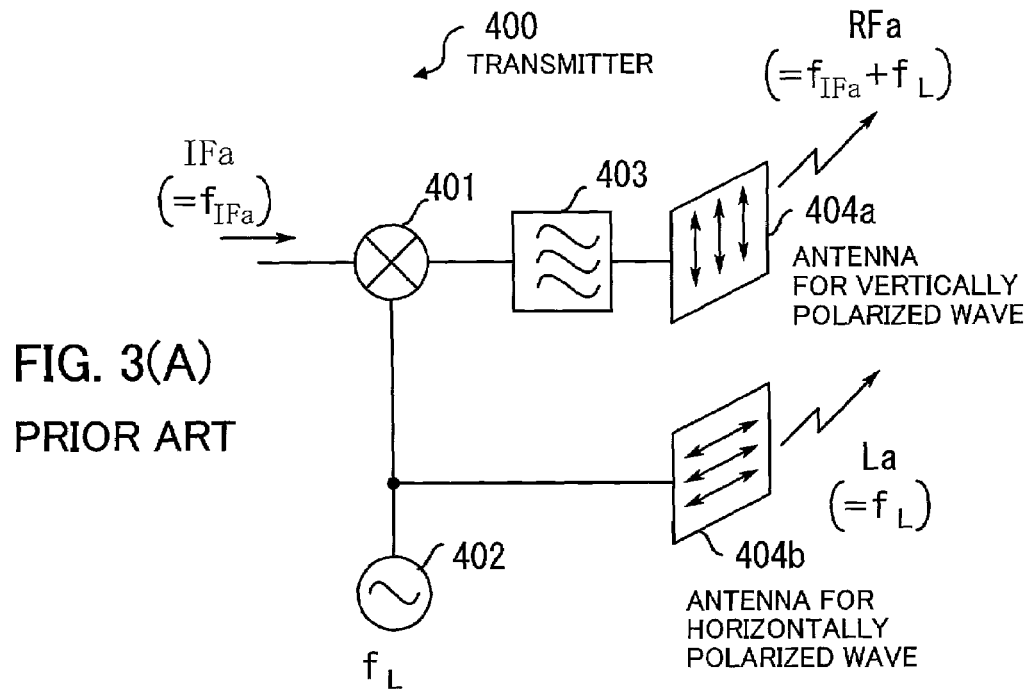
FIGS. 3(A) and 3(B) show the structure of a conventional system, illustrating a transmitter in FIG. 3(A) and a receiver in FIG. 3(B)
Figure 3B:
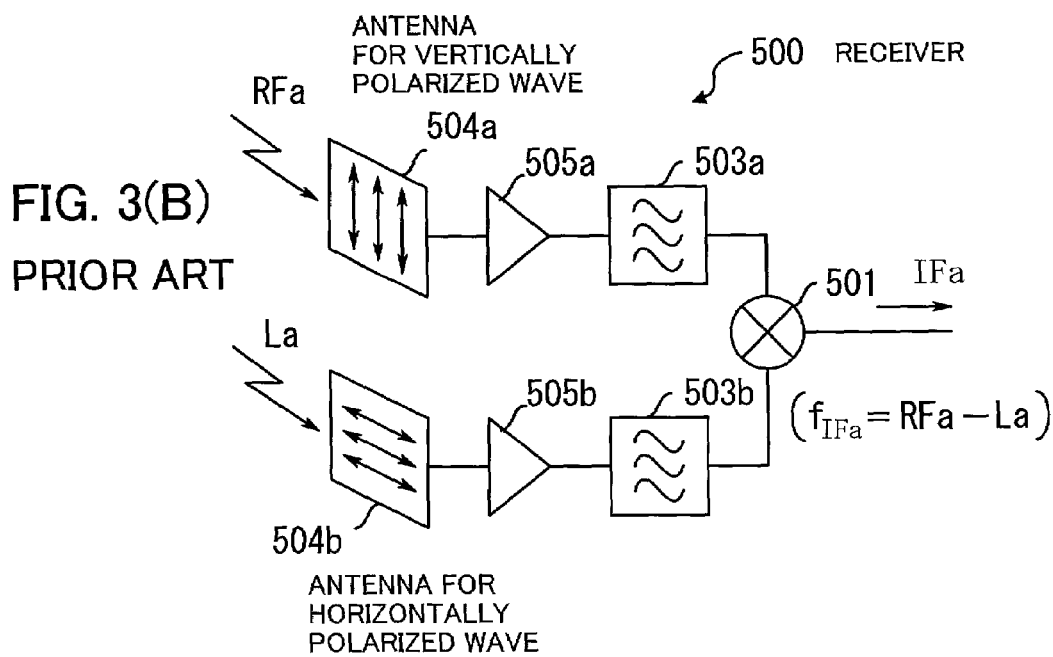
Figure 4:
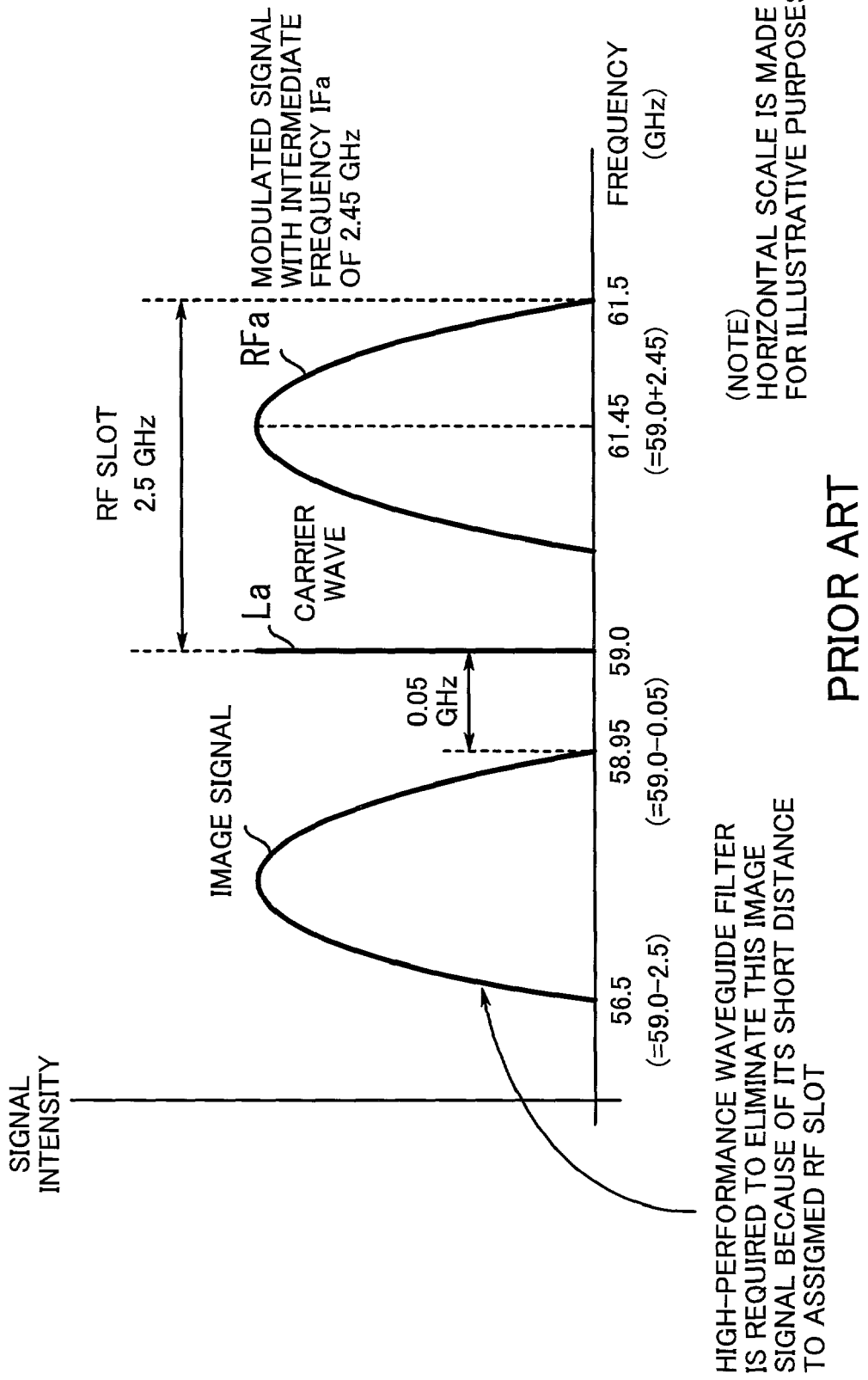
FIG. 4 shows a frequency spectrum of a conventional radio communications system.
Figure 5:
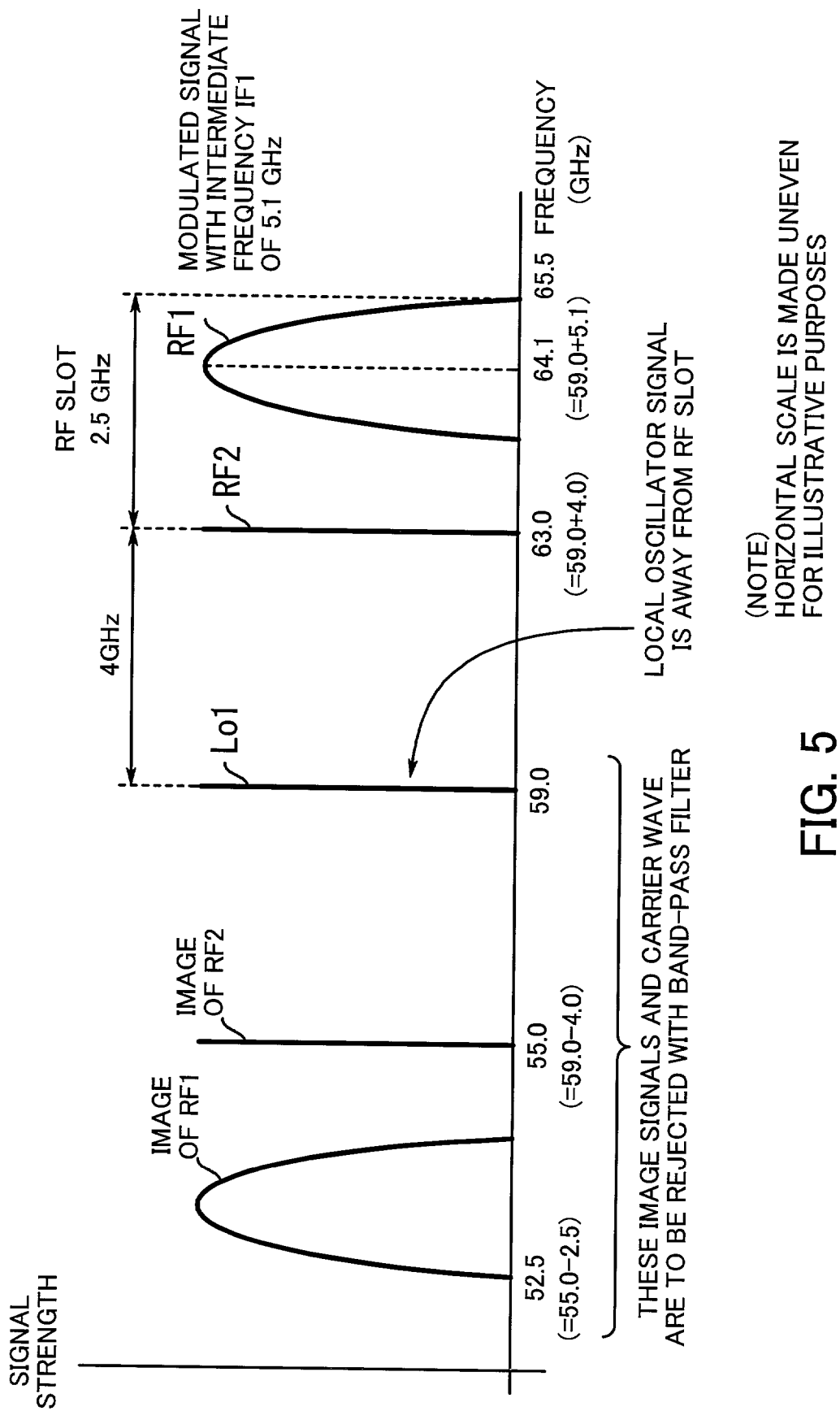
FIG. 5 shows a frequency spectrum of a radio communications system according to the present invention.

Referring next to FIGS. 3 to 5, a comparison between the present invention and a conventional technique will be presented. As discussed so far, the present invention proposes transmitting two signal waves for radio communication and to combine them at the receiving end. This proposed technique stands in contrast to a related technique found in the following paper: Y. Shoji, K. Hamaguchi, H. Ogawa, "Millimeter-wave communications system using self-heterodyne detection scheme," The Institute of Electronics, Information and Communication Engineers (IEICE), Communication Society Conference, B-5-135, 1999.

FIGS. 3(A) and 3(B) show the structure of a conventional system. This system, including a transmitter 400 depicted in FIG. 3(A) and a receiver 500 in FIG. 3(B), employs a detection technique that is known as the self-heterodyne system. More specifically, the transmitter 400 has a local oscillator 402 that generates a signal with a high frequency $f_L$ for up-converting a given modulated signal IFa with an intermediate frequency $f_{IFa}$. The resulting radio frequency signal RFa is fed to an antenna 404a via a filter 403 and radiated as a vertically polarized wave. At the same time, a non-modulated carrier signal La (a part of the local oscillator signal) is radiated from another antenna 404b in the form of a horizontally polarized wave. Note here that the two radio waves RFa and La are orthogonal with each other in terms of their polarization angles.

Referring to FIG. 3(B), the receiver 500 has two antennas 504a and 504b to receive two orthogonally polarized radio waves (i.e., vertically and horizontally polarized waves). They are amplified by amplifiers 505a and 505b, extracted by filters 503a and 503b, and entered to a mixer 501. The mixer 501 performs multiplication between the two input signals (i.e., radio frequency signal RFa and carrier signal La). This process yields their difference frequency component, which is exactly the original modulated signal IFa.

It should be noted that the receiver 500 uses no millimeter wave local oscillator to reproduce the intermediate frequency signal IFa. Because the mixer 501 receives the carrier signal La originating from the local oscillator in the transmitter 400 to down-convert the received radio frequency signal RFa, the communications system of FIGS. 3(A) and 3(B) is free from phase noises (aforementioned Δf) which could be included in its transmitter local oscillator signal. Despite its advantage, however, the system of FIGS. 3(A) and 3(B) is still difficult to implement in small, low-cost consumer products because of the reasons to be described below.

First, think of such a mixer circuit that up-converts an intermediate frequency signal (frequency: $f_{IF}$) to a higher frequency signal by mixing it with a local oscillator signal (frequency: $f_{Lo}$). It is known that the output signal of this mixer circuit is not a single-frequency radio wave, but contains more waves as follows: carrier wave (frequency: $f_{Lo}$), main radio frequency waves ($f_{IF}+f_{Lo}$), and its image signal waves ($f_{Lo}-f_{IF}$). The latter two are called "sidebands." In conventional systems, it is often needed to eliminate the image signal waves, while sending out the main radio frequency waves from the antenna, together with the carrier wave. Typically, an appropriate filter is used to eliminate the image signal waves, or lower sideband.

FIG. 4 shows a frequency spectrum of a conventional radio communications system, where the vertical axis represents the signal strength and the horizontal axis the frequency. For illustrative purposes, the horizontal scale is made uneven. The illustrated spectrum lies within the 60 GHz band, which is the widest allocated band among other millimeter-wave resources. This band has physical characteristics resilient to interference, and is thus expected to be used in various radio communications systems for low-cost high-bitrate applications.

The Japanese Radio Wave Law stipulates that each channel bandwidth should be 2.5 GHz in the 60 GHz radio band. In the conventional system of FIGS. 3(A) and 3(B), both the carrier signal La and radio frequency signal RFa should fit within a 2.5 GHz range. If not suppressed, the lower sideband signal would appear on the lower side of the carrier wave La, symmetrically with the upper sideband signal RFa.

It is supposed in FIG. 4 that the local oscillator frequency is 59.0 GHz, meaning that the modulated signal IFa has to fit within a 2.5 GHz frequency slot of 59.0 GHz to 61.5 GHz. It is also supposed that the modulated signal IFa has a spectrum ranging from 0.05 GHz to 2.5 GHz, around the intermediate frequency of 2.45 GHz. The 2.5 GHz frequency slot thus contains the 59 GHz carrier wave La and the radio frequency signal RFa deriving from the modulated signal IFa. This conventional spectrum arrangement involves an image of the radio frequency signal RFa, which would appear in a frequency range of 56.5 GHz to 58.95 GHz.

As seen from FIG. 4, the image signal, or unnecessary lower sideband, is located very closely to the 2.5 GHz-wide radio frequency slot, since the carrier signal La should be contained in that slot. This fact necessitates the conventional system to employ a waveguide filter whose roll-off characteristic is steep enough to remove the lower sideband effectively. Besides being costly, such a high-performance waveguide filter is hard to be integrated on a small semiconductor chip. For this reason, the conventional system is not suitable for low-cost and space-restricted applications.

FIG. 5 shows a frequency spectrum of a radio communications system according to the present invention, where the vertical axis represents the signal strength and the horizontal axis the frequency. Unlike the conventional system, the proposed system uses a 2.5 GHz-wide frequency slot to carry two radio frequency waves RF1 and RF2. In the example of FIG. 5, the transmitter has a local oscillator with a frequency Lo1 of 59.0 GHz to up-convert a modulated signal IF1 and a sinusoidal wave signal IF2. Here, the information-carrying modulated signal IF1 has an intermediate frequency of 5.1 GHz, and the sinusoidal wave signal IF2 has another intermediate frequency of 4 GHz. Those two signals IF1 and IF2 have to fit within a 2.5 GHz-wide frequency slot of 63.0 GHz to 65.5 GHz, when they are converted up to radio wave frequencies RF1 and RF2, respectively. The lower sideband signal, symmetrical with the upper sideband signal RF2, would appear in a range of 52.5 GHz to 55.0 GHz, should it be unsuppressed.

The transmitter local oscillator signal Lo1 is used for upconversion, as in the conventional system discussed earlier. The present invention, however, displaces it far from the intended frequency slot. That is, the local oscillator signal Lo1 appears as a carrier signal in the center of the spectrum, and the two radio frequency signals RF1 and RF2 and their respective images are symmetrically arranged on both sides of the transmitter local oscillator signal Lo1. While, in the example of FIG. 5, the transmitter local oscillator signal Lo1 is 4 GHz away from the radio frequency slot, it would be possible to rearrange the signals so as to provide a greater frequency separation.

The proposed arrangement of radio wave components allows us to use ordinary bandpass filters to suppress the image signals and carrier signal. Those unnecessary components can be removed effectively by using, for example, a planar filter which is formed as a planer circuit on a dielectric substrate. The present invention thus eliminates the need for expensive large filters such as waveguide filters, which have been required in conventional radio communications systems that operate at 60 GHz or other millimeter frequencies. This advantageous nature of the proposed system enables development of radio communication products targeted to cost-sensitive and space-restricted applications, without sacrificing their performance.

Figure 6:
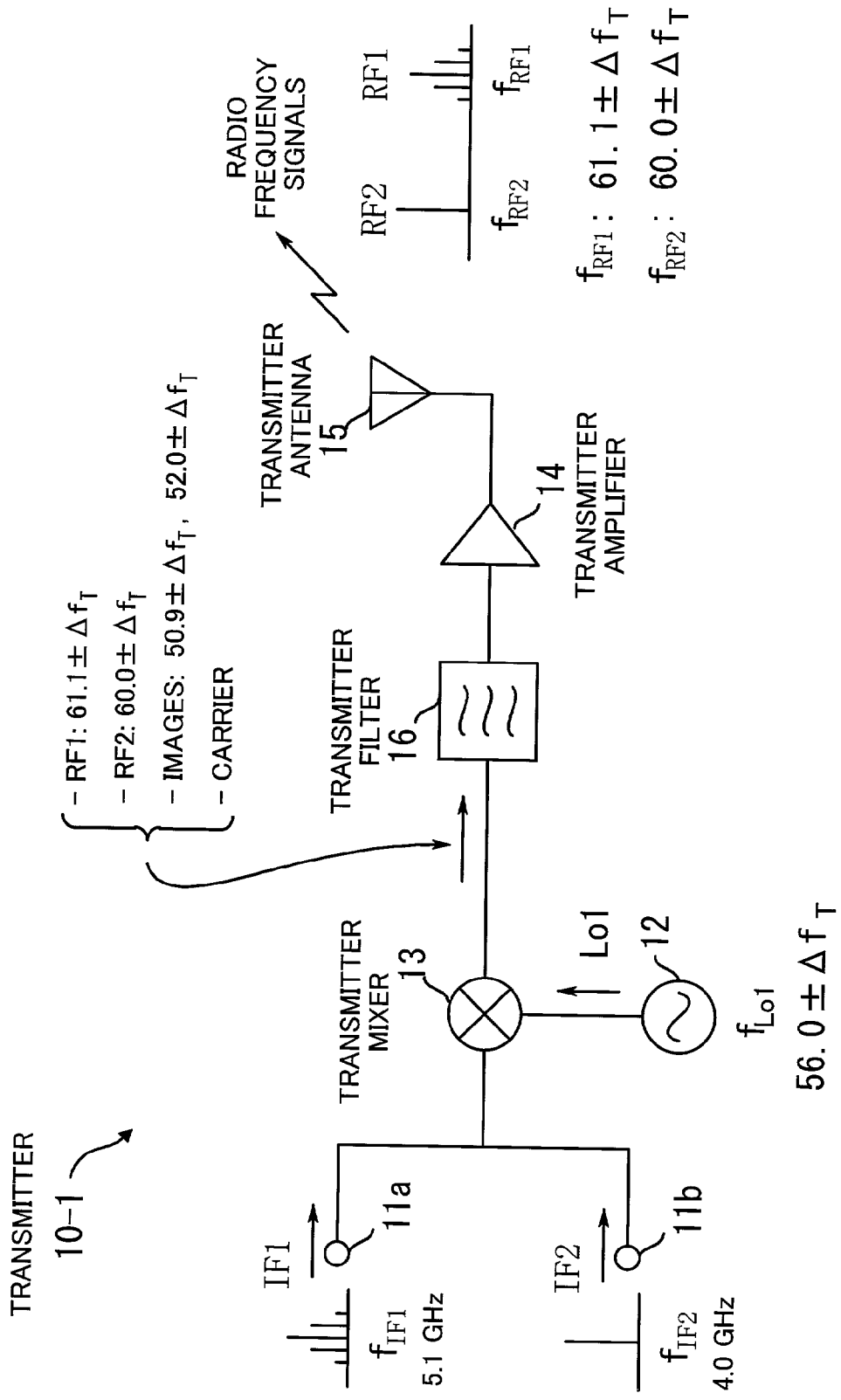
FIG. 6 shows the structure of a transmitter according to a first embodiment of the present invention.
Figure 7:
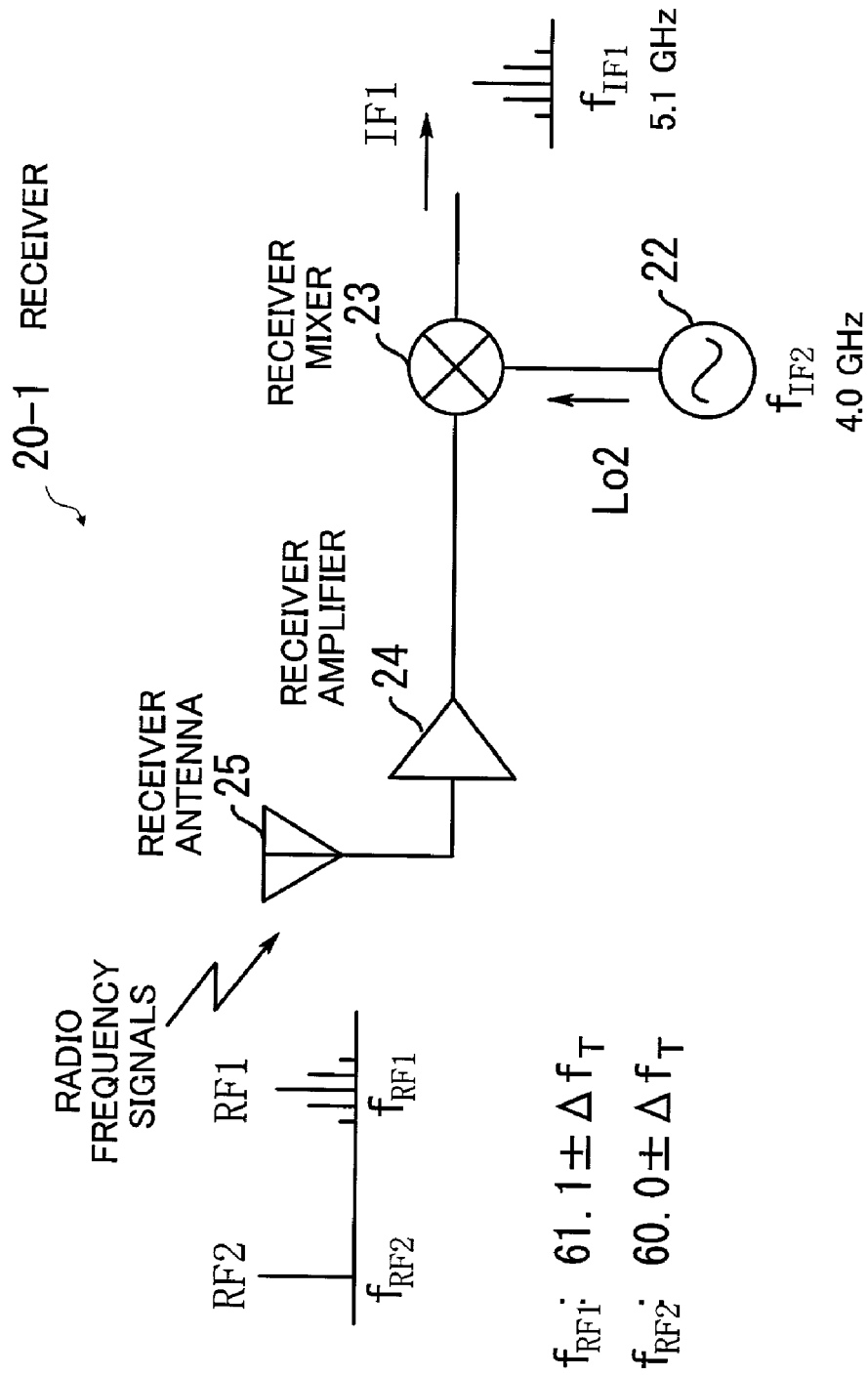
FIG. 7 shows the structure of a receiver according to the first embodiment of the present invention.

Referring next to FIGS. 6 and 7, the operation of the present invention will be discussed below, together with a more specific transmitter and its design parameters. FIG. 6 shows the structure of a transmitter according to a first embodiment of the present invention. The illustrated transmitter 10-1 is constructed with the following components: a first input terminal 11a, a second input terminal 11b, a transmitter local oscillator 12, a transmitter mixer 13, a transmitter filter 16, a transmitter amplifier 14, and a transmitter antenna 15. Among those elements, the transmitter local oscillator 12, transmitter mixer 13, and transmitter amplifier 14 are integrated into a single-chip device called a microwave monolithic IC (MMIC). The transmitter filter 16 is a planar filter created by forming a conductive film on a ceramic substrate. Likewise, the transmitter antenna 15 is a planar antenna produced by depositing a conductive film on a quartz substrate. The first and second input terminals 11a and 11b refer to the points at which input signals to the transmitter mixer 13 are received from relevant external sources.

Through its first input terminal 11a, the transmitter 10-1 receives a signal IF1 with a frequency $f_{IF1}$ of 5.1 GHz, which is modulated with a quadrature phase shift keying (QPSK or 4PSK) technique to transport data at the rate of 156 Mbps. At the same time, it receives a sinusoidal wave signal IF2 with a frequency $f_{IF2}$ of 4.0 GHz through the second input terminal 11b. These input signals are supplied to the transmitter mixer 13.

The transmitter local oscillator 12 generates a transmitter local oscillator signal Lo1 at a frequency $f_{Lo1}$ of $(56.0 \pm \Delta f_T)$ GHz, where the symbol $\Delta f_T$ represents frequency fluctuations which are inevitable because no special frequency stabilization mechanisms (e.g., PLLs) are employed. The transmitter mixer 13 combines the modulated signal IF1, sinusoidal wave signal IF2, and transmitter local oscillator signal Lo1 in an appropriate manner. This mixing operation results in the following two radio frequency signals: a first radio frequency signal RF1 with a frequency $f_{RF1}$ of $(61.1 \pm \Delta f_T)$ GHz, and a second radio frequency signal RF2 with a frequency $f_{RF2}$ of $(60.0 \pm \Delta f_T)$ GHz.

The transmitter mixer 13 also outputs image signals with the frequencies of $(50.9 \pm \Delta f_T)$ and $(52.0 \pm \Delta f_T)$ GHz, as well as a carrier signal deriving from the transmitter local oscillator signal Lo1. The transmitter filter 16 suppresses those image signals and carrier signal to a sufficiently low level, as described in FIG. 5, thus passing only the intended signals RF1 and RF2 to the transmitter amplifier 14. The transmitter amplifier 14 boosts the signals RF1 and RF2 up to any desired level (e.g., 10 dBm). Finally, the transmitter antenna 15 sends out the amplified radio frequency signals RF1 and RF2 into the air.

FIG. 7 shows the structure of a receiver according to the first embodiment of the present invention. The illustrated receiver 20-1 is composed of the following elements: a receiver antenna 25, a receiver amplifier (LNA: Low Noise Amplifier) 24, a receiver mixer 23, and a receiver local oscillator 22. Among those elements, the receiver local oscillator 22, receiver mixer 23, and receiver amplifier 24 are implemented as a single-chip MMIC. The receiver antenna 25 is a planar antenna produced by depositing a conductive film on a quartz substrate.

The receiver 20-1 receives the transmitted radio wave signals RF1 and RF2 at its receiver antenna 25. They are amplified by the receiver amplifier 24 and supplied to the receiver mixer 23. The receiver local oscillator 22 generates a receiver local oscillator signal Lo2 with the same frequency as the sinusoidal wave signal IF2 produced at the transmitting end. Specifically, the frequency $f_{Lo2}$ of that local oscillator signal Lo2 is 4.0 GHz, which is equal to $f_{IF2}$.

The receiver mixer 23 combines the two radio frequency signals RF1 and RF2 and the receiver local oscillator signal Lo2 in an appropriate manner, so that the following operation will take place.

$$RF1 - RF2 + Lo2 = f_{RF1} - f_{RF2} + f_{Lo2} \quad (3)$$
$$= (61.1 \pm \Delta f_T) - (60.0 \pm \Delta f_T) + 4.0$$
$$= 5.1 \text{ GHz } (= f_{IF1})$$

Accordingly, the receiver mixer 23 outputs the original modulated signal IF1 (156 Mbps, QPSK).

Figure 8:
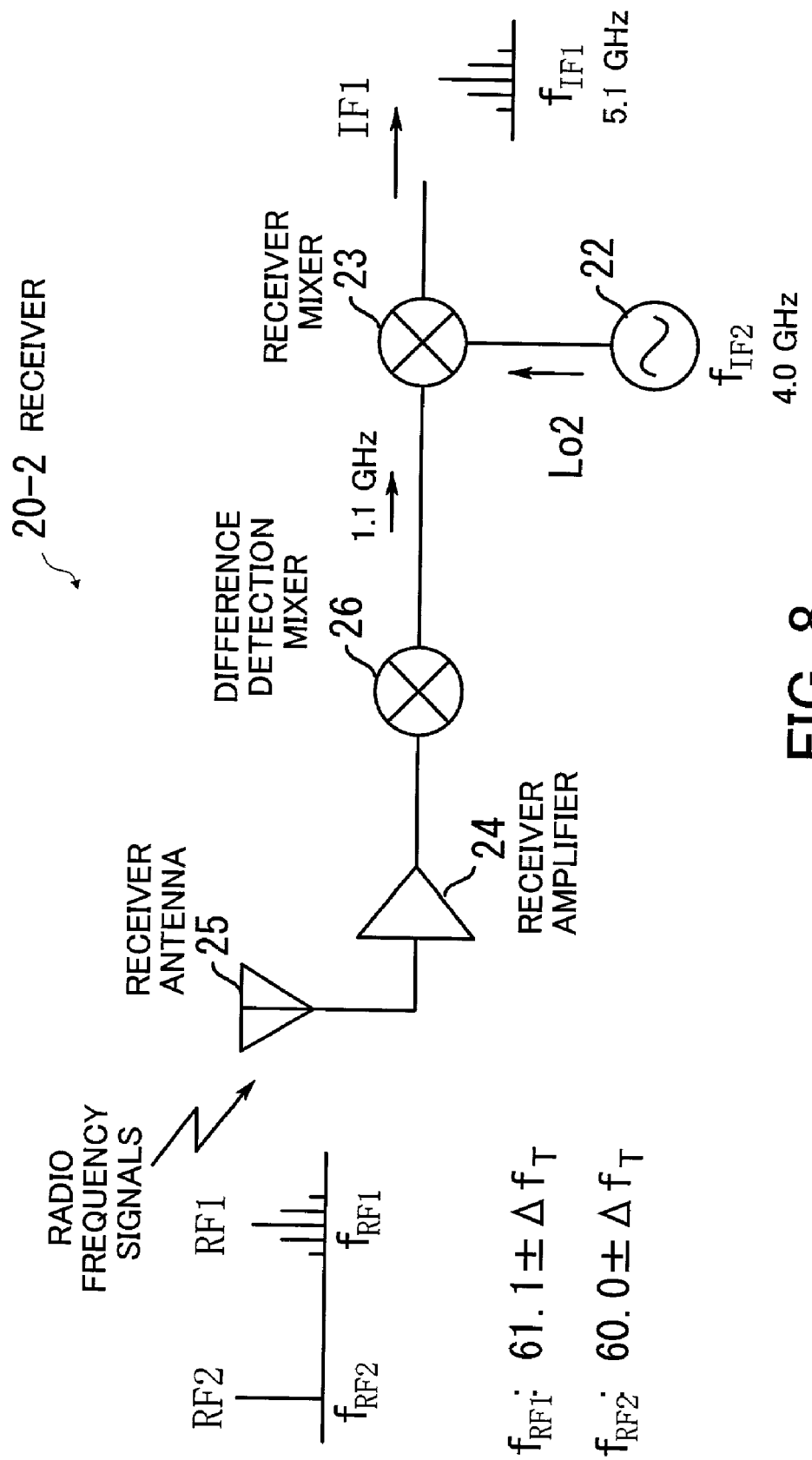
FIG. 8 shows the structure of a receiver according to a second embodiment of the present invention.

Referring next to FIG. 8, a second embodiment of the present invention will be explained below. FIG. 8 shows the structure of a receiver 20-2 according to the second embodiment. This receiver 20-2 is designed to operate in combination with the transmitter 10-1 of the first embodiment. See the previous section for details of the transmitter 10-1.

The receiver 20-2 of the second embodiment is composed of a receiver antenna 25, a receiver amplifier 24, a difference detection mixer 26, a receiver mixer 23, and a receiver local oscillator 22. The receiver antenna 25 catches incoming radio waves RF1 and RF2 and supplies the received signals to the receiver amplifier 24 for amplification. With those amplified signals RF1 and RF2, the difference detection mixer 26 performs the operation shown in (4), thereby detecting difference frequency components between them.

$$RF1 - RF2 = f_{RF1} - f_{RF2} \quad (4)$$
$$= (61.1 \pm \Delta f_T) - (60.0 \pm \Delta f_T)$$
$$= 1.1 \text{ GHz}$$

This equation (4) tells us that the difference detection mixer 26 cancels the frequency fluctuation terms $\Delta f_T$, the unstable components contained in the output of the transmitter local oscillator 12. The difference detection mixer 26 sends its outcomes to the receiver mixer 23 for upconversion with a receiver local oscillator signal Lo2 (equivalent to the sinusoidal wave signal IF2 in the transmitter 10-1), thus reproducing the original modulated signal IF1 (156 Mbps, QPSK) with the intermediate frequency of 5.1 GHz. As seen from the above, the second embodiment differs from the first embodiment in that the received signals are down-converted to a lower frequency before being mixed with a local oscillator signal. This two-stage mixer design distributes the required frequency conversion tasks.

Figure 9:
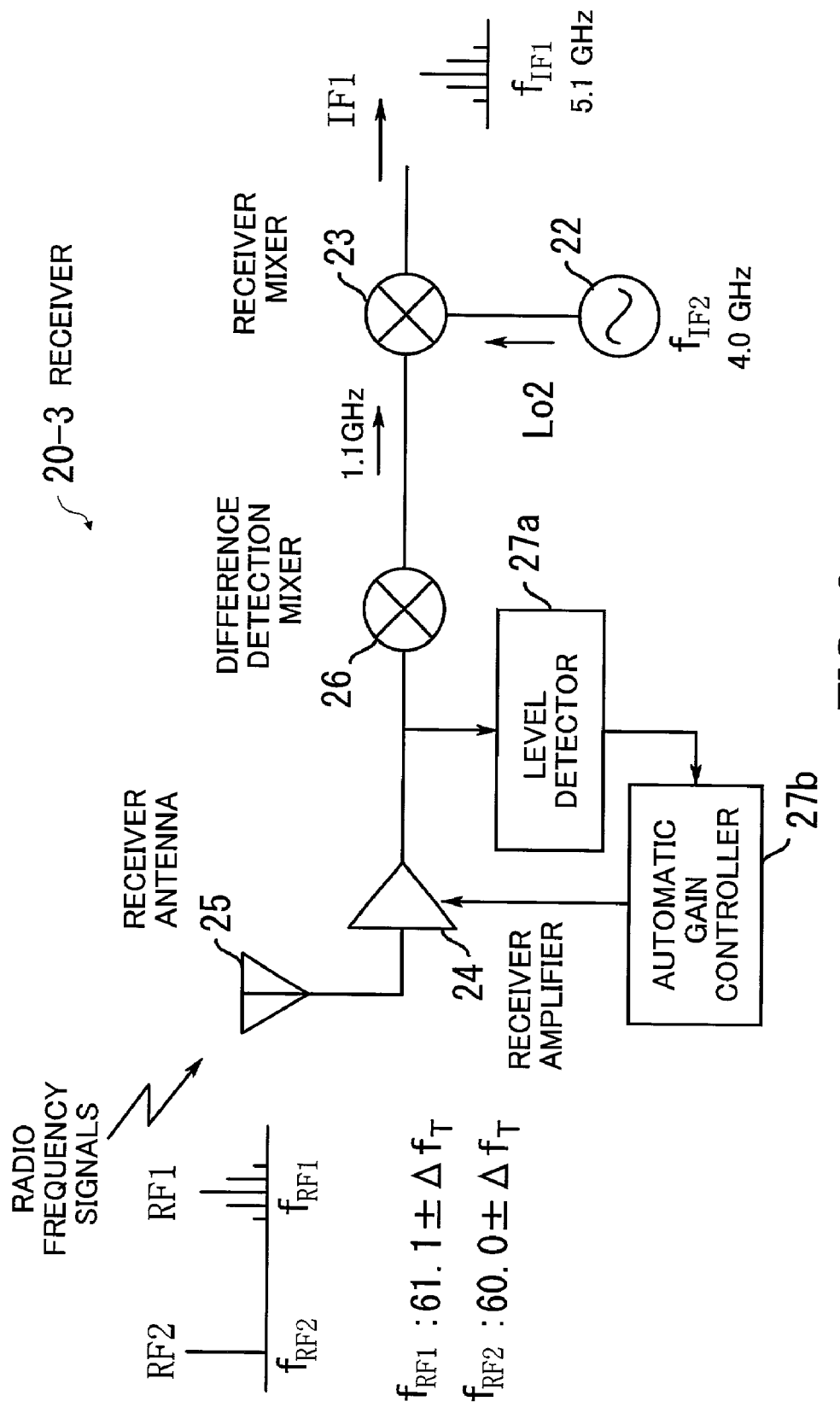
FIG. 9 shows the structure of a receiver according to a third embodiment of the present invention.

Referring next to FIG. 9, a third embodiment of the present invention will be explained below. FIG. 9 shows the structure of a receiver 20-2 according to the third embodiment. This receiver 20-2 is designed to operate in combination with the transmitter 10-1 of the first embodiment, the details of which are found in an earlier section.

According to the third embodiment, the receiver 20-3 is composed of a receiver antenna 25, a receiver amplifier 24, a difference detection mixer 26, a receiver mixer 23, a receiver local oscillator 22, a level detector 27a, and an automatic gain controller 27b.

Incoming radio wave signals RF1 and RF2 are sent from the receiver antenna 25 to the difference detection mixer 26 after being amplified by the receiver amplifier 24. The third embodiment is different from the preceding embodiments in that the gain of the receiver amplifier 24 is variable. More specifically, the level detector 27a measures the output signal of the receiver amplifier 24 and sends the detected signal level to the automatic gain controller 27b. The automatic gain controller 27b then adjusts the output gain of the receiver amplifier 24 in such a way that the difference detection mixer 26 will exhibit a maximum efficiency in frequency conversion, thus enabling more accurate signal processing. The output of the difference detection mixer 26 is processed in the same manner as described earlier in the second embodiment.

While the above-described second and third embodiments employ a second mixer next to the difference detection mixer 26 to yield a modulated intermediate-frequency signal IF1, the present invention should not be limited to this particular configuration. It is possible to eliminate the receiver local oscillator 22 and receiver mixer 23 in an alternative implementation. If this is the case, the difference component signal (1.1 GHz), the output of the difference detection mixer 26 is passed directly to the subsequent stage (not shown) of the receiver 20-2 or 20-3.

Figure 10:
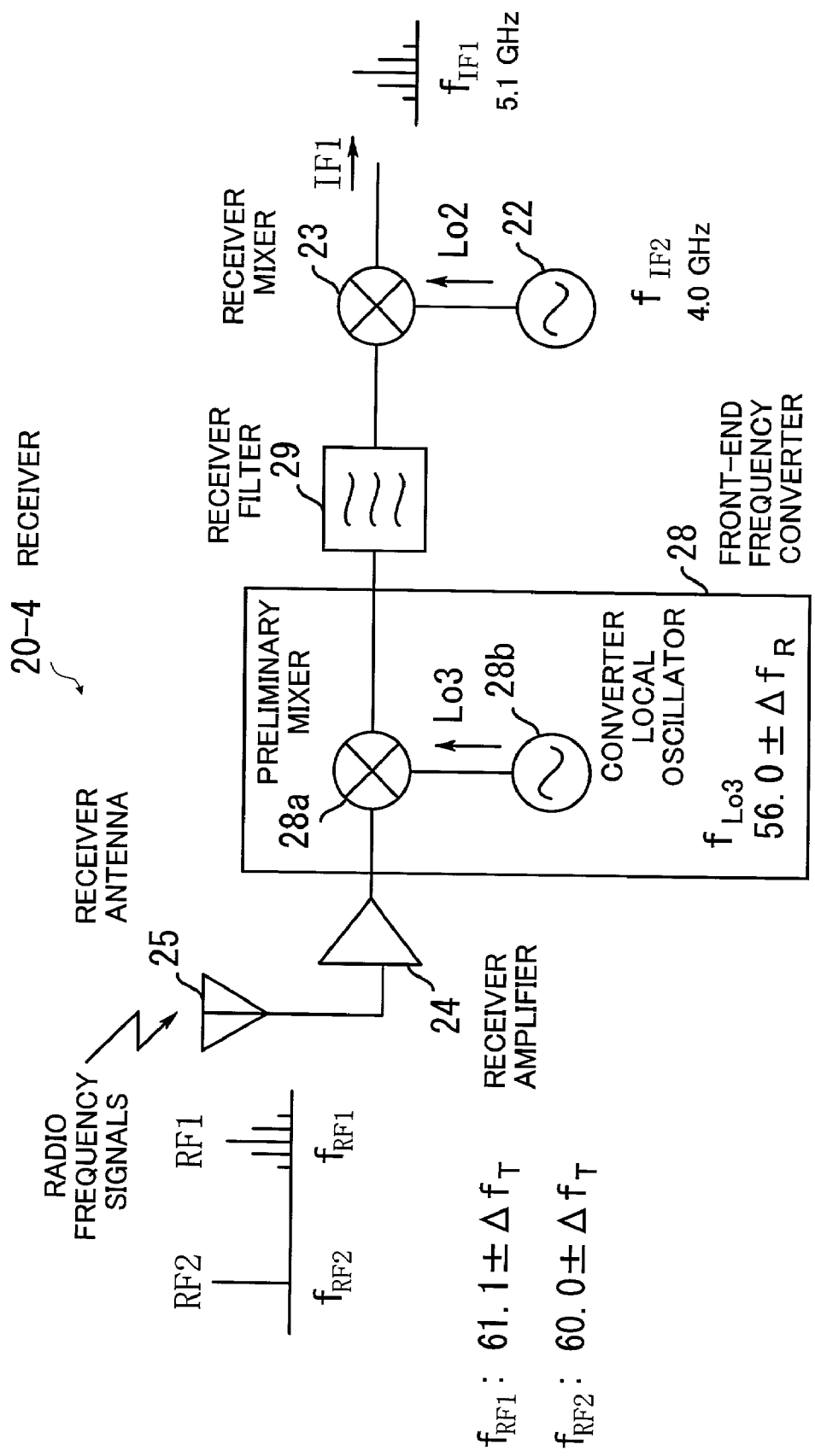
FIG. 10 shows the structure of a receiver according to a fourth embodiment of the present invention.

Referring next to FIG. 10, a forth embodiment of the present invention will be explained below. FIG. 10 shows the structure of a receiver 20-4 according to the fourth embodiment. This receiver 20-4 is designed to operate in combination with the transmitter 10-1 of the first embodiment, the details of which have been explained in an earlier part of this description.

According to the fourth embodiment, the receiver 20-4 is composed of the following elements: a receiver antenna 25, a receiver amplifier 24, a front-end frequency converter 28, a receiver filter 29, a receiver mixer 23, and a receiver local oscillator 22. Further, the front-end frequency converter 28 includes a preliminary mixer 28a and a converter local oscillator 28b.

Incoming radio wave signals RF1 and RF2 at the receiver antenna 25 are amplified by the receiver amplifier 24. The converter local oscillator 28b generates a local oscillator signal Lo3 with a frequency of 56.0 GHz, which is equivalent to what is produced by the transmitter local oscillator 12 at the transmitting end. This local oscillator signal Lo3, however, has a certain amount of instability $\Delta f_R$ since the converter local oscillator 28b is not equipped with a PLL or any other special stabilization mechanism, as often seen in ordinary high-frequency oscillators. Taking such unstable components $\Delta f_R$ into consideration, the frequency of the local oscillator signal Lo3 is expressed as $(56.0 \pm \Delta f_R)$ GHz.

The preliminary mixer 28a combines the received radio frequency signals RF1 and RF2 with the local oscillator signal Lo3, thereby converting the two input signal RF1 and RF2 down to lower frequencies $(5.1 \pm \Delta f_T \pm \Delta f_R)$ and $(4.0 \pm \Delta f_T \pm \Delta f_R)$ GHz, respectively. Here, the converter local oscillator 28b maintains its output power level in such a way that the preliminary mixer 28a will exhibit a maximum conversion performance in its frequency mixing operation.

The downconverted signals are then directed to the receiver filter 29 to eliminate unwanted frequency components. The receiver mixer 23 combines them with a receiver local oscillator signal Lo2 in an appropriate manner, so that the following operation will occur.

$$(5.1 \pm \Delta f_T \pm \Delta f_R) - (4.0 \pm \Delta f_T \pm \Delta f_R) + f_{IF2} = 1.1 + 4.0 = 5.1 \text{ GHz} \quad (5)$$

As a result of this mixing process, the original modulated signal IF1 (156 Mbps, QPSK) is reproduced.

Figure 11:
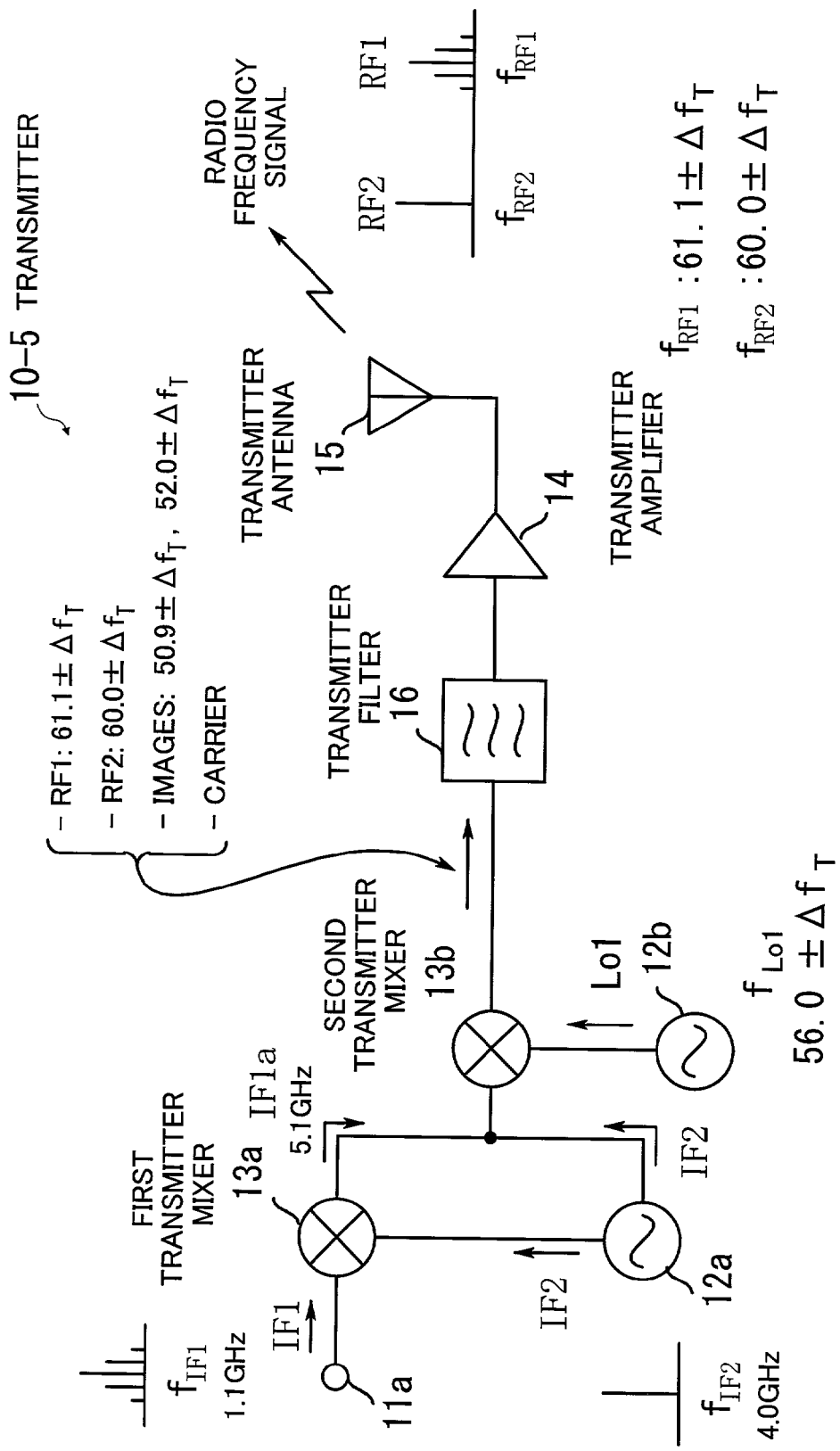
FIG. 11 shows the structure of a transmitter according to a fifth embodiment of the present invention.
Figure 12:
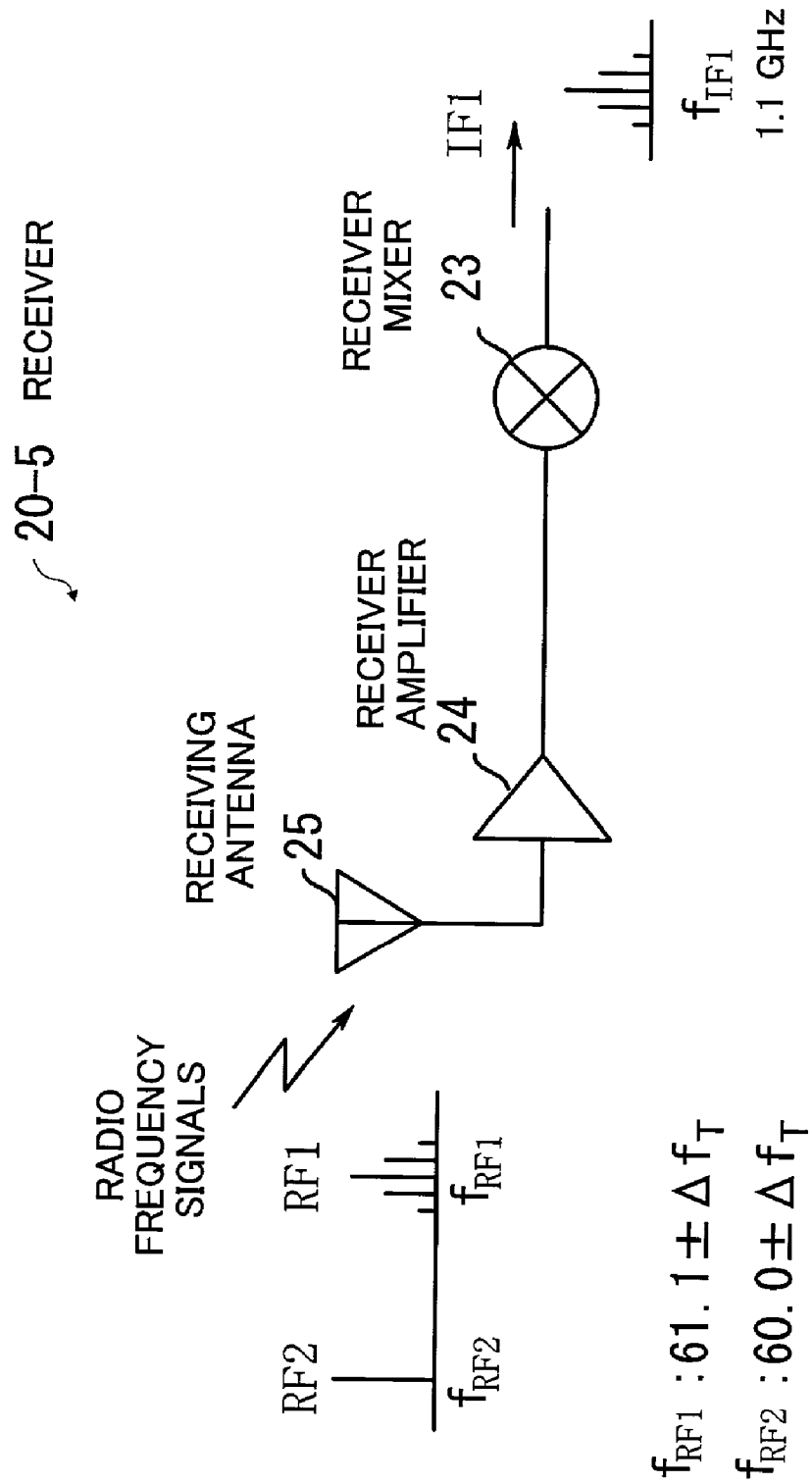
FIG. 12 shows the structure of a receiver according to the fifth embodiment of the present invention.

Referring next to FIGS. 11 and 12, a fifth embodiment of the present invention will be explained below. FIG. 11 shows the structure of a transmitter 10-5 according to the fifth embodiment. This transmitter 10-5 is composed of the following elements: a first input terminal 11a, a receiver local oscillator 12a, a first transmitter mixer 13a, a second transmitter mixer 13b, a transmitter local oscillator 12b, a transmitter filter 16, a transmitter amplifier 14, and a transmitter antenna 15.

The receiver local oscillator 12a produces a local oscillator signal IF2 with a frequency $f_{IF2}$ of 4.0 GHz. Through its first input terminal 11a, the transmitter 10-5 receives a QPSK-modulated signal IF1 with a frequency $f_{IF1}$ of 1.1 GHz, which conveys information at the rate of 156 Mbps. The first transmitter mixer 13a upconverts the modulated signal IF1 with the local oscillator signal IF2, thus producing an intermediate frequency signal IF1a with a raised frequency of 5.1 GHz.

The transmitter local oscillator 12b, on the other hand, generates a transmitter local oscillator signal Lo1 at a frequency fLo1 of $(56.0 \pm \Delta f_T)$ GHz, where the symbol $\Delta f_T$ refers to frequency fluctuations which are inevitable because of the lack of a frequency stabilization mechanism such as PLL. The second transmitter mixer 13b combines the above two signals IF1a and IF2 with the transmitter local oscillator signal Lo1, thus yielding a mixture of the following signals: a first radio frequency signal RF1 with a frequency $f_{RF1}$ of $(61.1 \pm \Delta f_T)$ GHz, and a second radio frequency signal RF2 with a frequency $f_{RF2}$ of $(60.0 \pm \Delta f_T)$ GHz. Additionally, the output of the second transmitter mixer 13b contains the images of the two radio frequency signals RF1 and RF2 and a carrier signal (leakage of the transmitter local oscillator signal Lo1), where the image signals have the frequencies of $(50.9 \pm \Delta f_T)$ and $(52.0 \pm \Delta f_T)$ GHz. Those image signals and carrier signal are suppressed sufficiently by the transmitter filter 16. The remaining signals RF1 and RF2 are amplified by the transmitter amplifier 14 and radiated into the air through the transmitter antenna 15.

FIG. 12 shows the structure of a receiver 20-5 according to the fifth embodiment of the present invention. This receiver 20-5 is composed of a receiver antenna 25, a receiver amplifier 24, and a receiver mixer 23.

The illustrated receiver 20-5 receives incoming radio frequency signals RF1 and RF2 at its receiver antenna 25, which are amplified by the receiver amplifier 24 and supplied to the receiver mixer 23. The receiver mixer 23 mixes the received signals RF1 and RF2 together, thereby performing the operation represented in equation (4). The receiver mixer 23 outputs a modulated signal IF1 (156 Mbps, QPSK) with an intermediate frequency of 1.1 GHz, where frequency fluctuations $\Delta f_T$ introduced at the transmitter 10-5 are canceled out at the receiver 20-5.

The above-described fifth embodiment is distinguishable from preceding ones in that the first input terminal 11a receives an information-carrying modulated signal which has an intermediate frequency that is equal to the frequency difference between two radio frequency waves to be transmitted into the air. In the example of FIG. 11, the intermediate frequency is 1.1 GHz, i.e., 61.1 GHz (RF1) minus 60.0 GHz (RF2). Such a modulated signal is up-converted through two stages: firstly with a lower radio frequency, and secondly with a millimeter wave frequency. This structure of the transmitter permits the corresponding receiver to yield the original modulated signal with the intermediate frequency by directly mixing two incoming radio waves and extracting their difference. Note that there is no need for the receiver to have its own local oscillator.

The foregoing examples have shown that the present invention sends a first and second radio wave signals from a transmitter, and a receiver reproduces the original signal by detecting their difference frequency components. When there are two or more transmitters having different information to send, the frequency difference between the first and second signals has to be unique to each individual transmitter in order to allow a receiver to selectively reproduce one signal. In other words, one frequency difference should be uniquely assigned to one information channel. To this end, the transmitter 10 may optionally be equipped with a mechanism to make the frequency difference programmable. For example, think of a transmitter having a plurality of second input terminals 11b to accept different frequencies. Such a transmitter is configured to select one of these terminals 11b, thereby avoiding interference with other transmitters. The associated receivers are thus configured to extract a desired information signal from a set of first and second radio frequency signals having a particular frequency difference that is specified.

According to the embodiments described above, a sinusoidal wave is used as a second signal. The second signal, however, should not be limited to that specific type of wave, but the present invention would work properly with a square wave if the following issue is considered in designing the system.

It is known that a square wave has many higher frequency components other than its fundamental frequency component, as opposed to a sinusoidal wave, which consists only of a single frequency component. When a receiver reconstructs the first signal through a process of mixing two received radio frequency signals, those higher frequency components of the square wave would be distorted in that mixing process at the receiving end. The receiver, however, can compensate for such distortion because it knows what frequency components are contained in the square wave being used.

More specifically, when a modulated signal and a square wave signal are mixed with a carrier frequency signal at the transmitting end, the resulting signal would have a broader spectrum than the original one. This is because the square wave has a wide range of frequency components, as one can see in the Fourier transform analysis. Since this nature is known, it is possible for the receiver to recover the original spectrum by producing a square wave signal that is synchronized with that used in the transmitting end and mixing receive signals with the square wave signal. The original modulated signal can be reproduced by extracting difference frequency components from the mixed signals. While it is similar to signal processing with a pseudo noise sequence (PN-code) in spread spectrum communications systems, this mixing process is easier to implement because the receiver has only to synchronize either the rising edge or the falling edge of its local square wave with that of the transmitter.

According to still another aspect of the present invention, the second signal may have substantially the same frequency as the first signal frequency. In this case, the transmitted radio waves would contain a carrier wave and combined waves of the first and second signals. When a sinusoidal wave is used as the second signal, the central portion of the frequency spectrum would be distorted with that sinusoidal component. When a square wave is used, the spectrum would spread. The receivers of the present invention can remove those distortions.

According to yet another aspect of the present invention, the first signal can be a baseband signal, rather than an intermediate frequency signal. The proposed transmitter mixer may combine a baseband signal with a carrier wave signal, together with an appropriate second signal. In this case, the second signal may not necessarily be an intermediate frequency signal.

Further, the present invention supports transmission of multiple-channel signals such as television signals. More specifically, a transmitter of the present invention receives television signals from a roof-top antenna and retransmits them to television sets located in a house, where the television sets have a receiver according to the present invention. This system enables wireless distribution of television signals, allowing people to locate television sets anywhere in the house without the need for routing conventional feeder cables.

Figure 13:
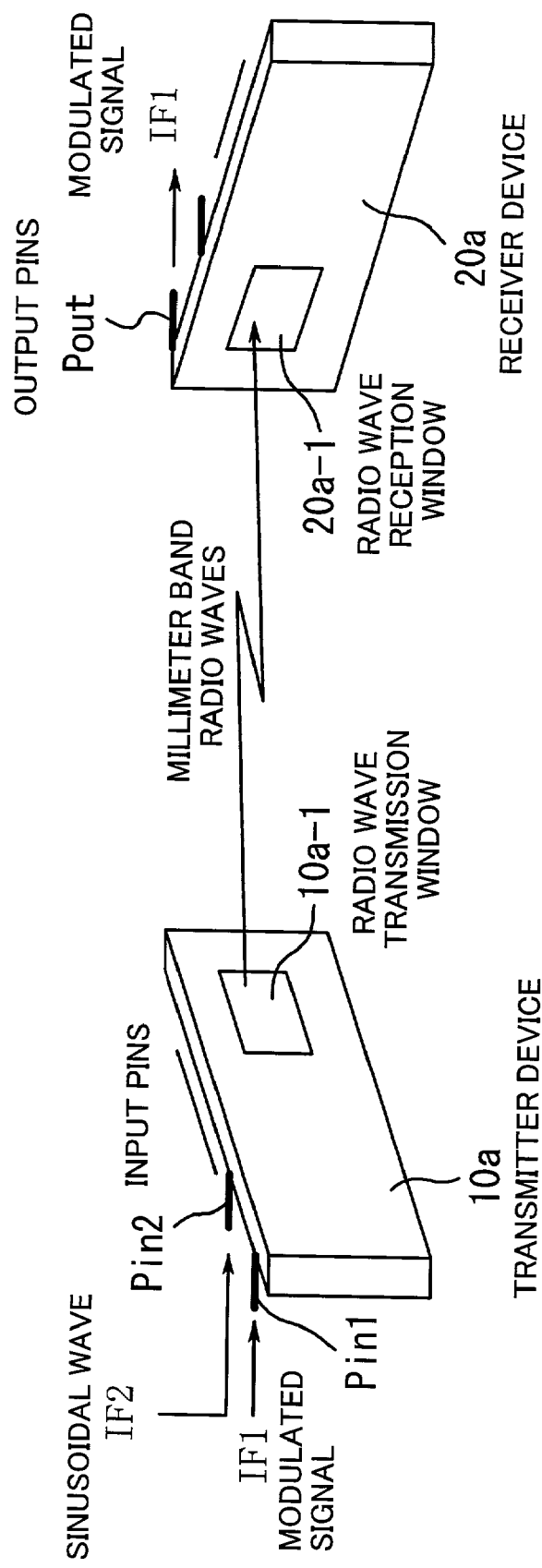
FIG. 13 schematically shows semiconductor devices designed for millimeter wave radio communication.
Figure 14:
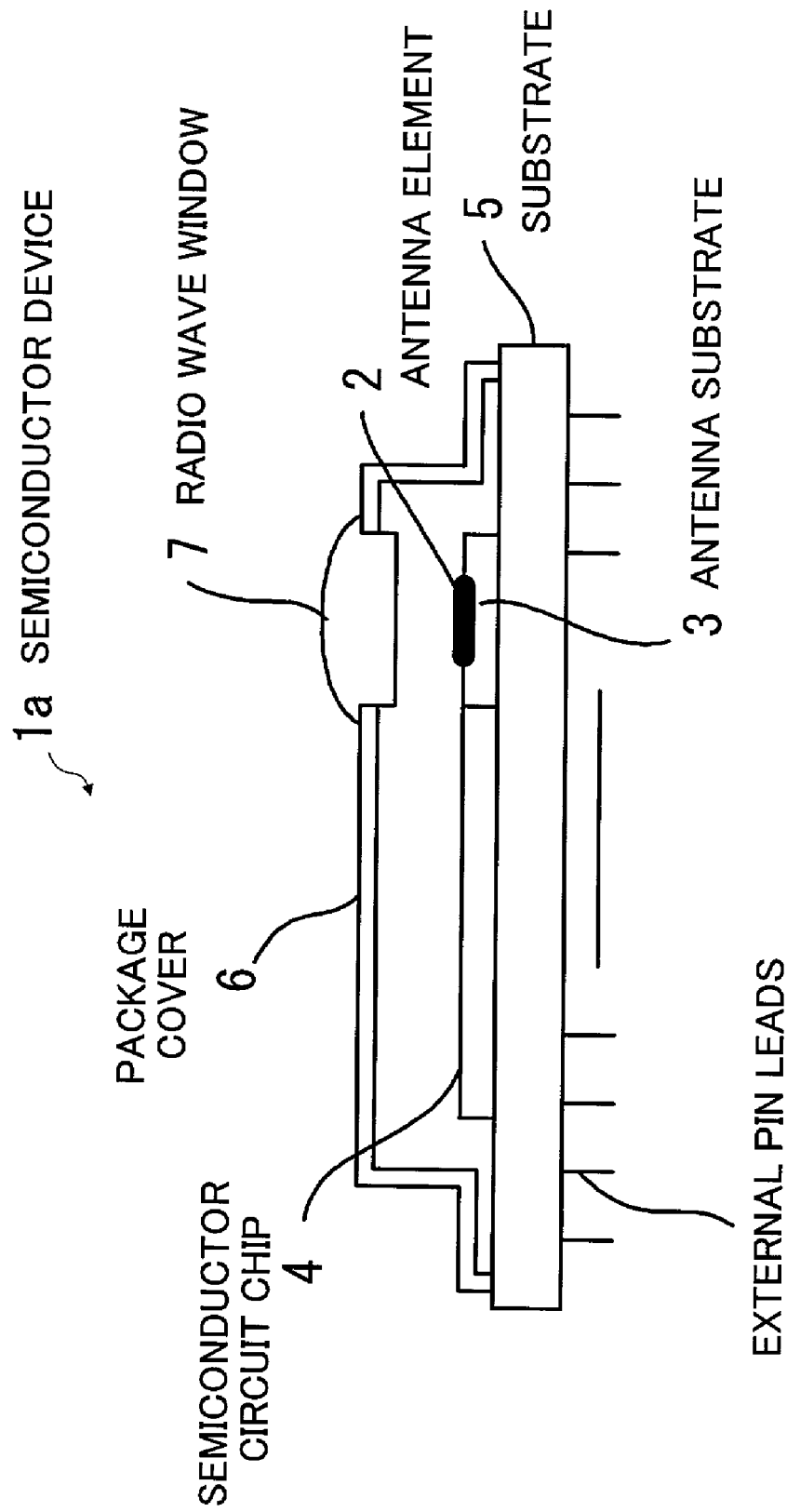
FIG. 14 shows a structure of a semiconductor device.

Referring next to FIGS. 13 and 14, the structure of transmitter and receiver modules will be explained below. FIG. 13 schematically shows a pair of semiconductor devices, a transmitter device 10a on the left and a receiver device 20a on the right. The transmitter device 10a is a semiconductor device; all circuit blocks of the proposed transmitter 10 are integrated on a single substrate. This device 10a has a small opening (a radio wave transmission window 10a-1) through which the radio wave radiated from its integral planar antenna goes out.

The receiver device 20a is a semiconductor device; all circuit blocks of the proposed receiver 20 are integrated on a single substrate. As with the transmitter device 10a, this receiver device 20a has a small opening (a radio wave reception window 20a-1) to receive incoming radio waves at its integral planar antenna.

The transmitter device 10a has two input pins Pin1 and Pin2 to receive a modulated signal IF1 and a sinusoidal wave signal IF2, respectively. These signals are processed by the on-chip circuit, and the resulting millimeter radio waves are radiated into the air through the radio wave transmission window 10a-1. Such millimeter radio waves reach the integrated antenna of the receiver device 20a through its radio wave reception window 20a-1. They are processed by the circuit in the receiver chip, and the reproduced modulated signal IF1 appears at an output pin Pout.

FIG. 14 is a cross-sectional view that shows a typical structure of the semiconductor devices described in FIG. 13, including both the transmitter device 10a and receiver device 20a. The illustrated semiconductor device 1a has a substrate 5 having external pin leads on its underside, on which an antenna substrate 3 and a semiconductor circuit chip 4 are mounted. Formed on the antenna substrate 3 is a planar antenna element 2. Being coupled to the antenna element 2, the semiconductor circuit chip 4 handles millimeter wave signals. A package cover 6 is placed on the upper side of the substrate 5, so that the antenna element 2 and semiconductor circuit chip 4 will be sealed hermetically. The package cover 6 has a radio wave window 7 just above the antenna element 2, which is made of non-conductive materials so that radio waves go through.

Figure 15:
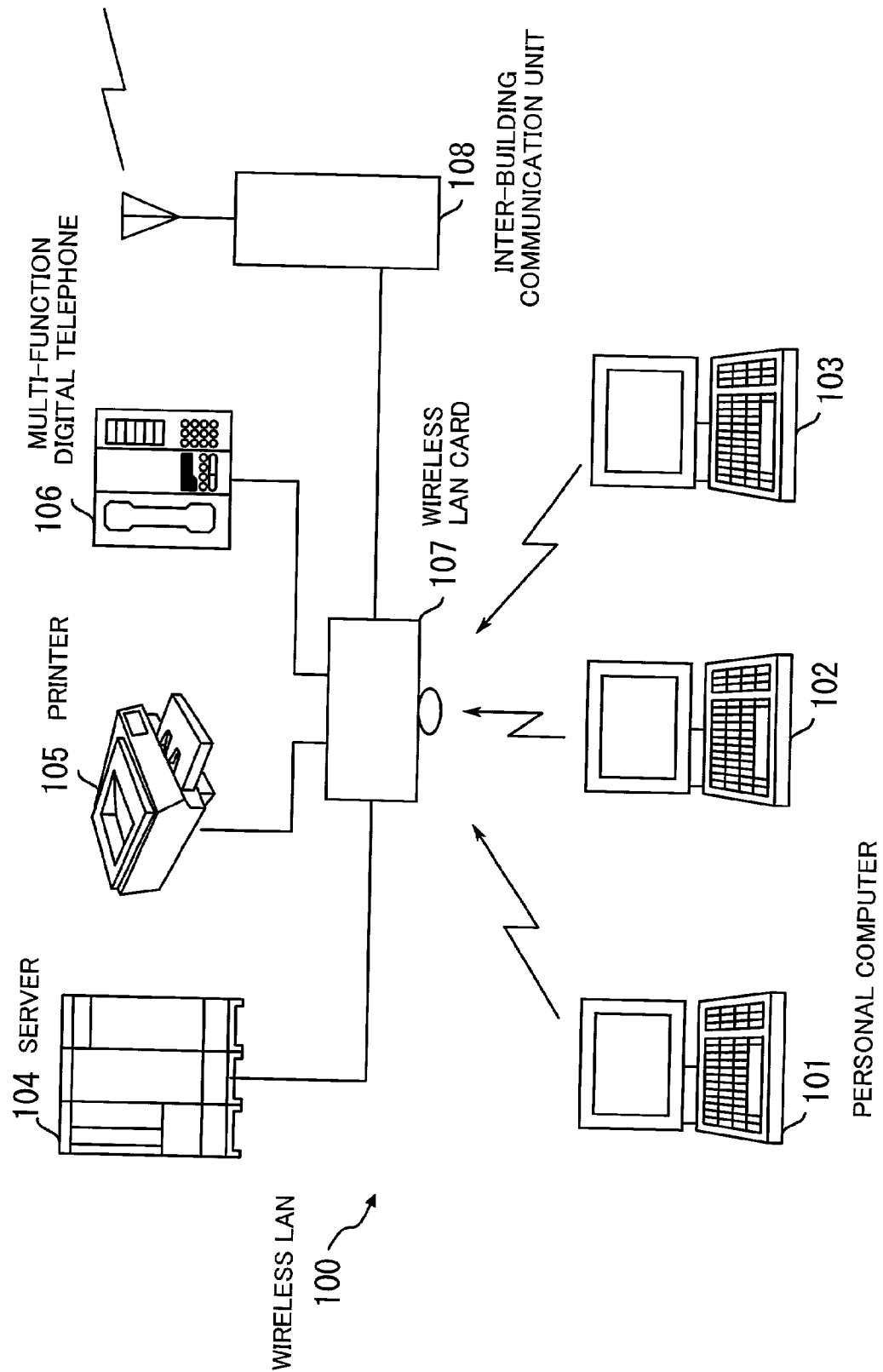
FIG. 15 shows a typical application of the present invention.
Figure 16:
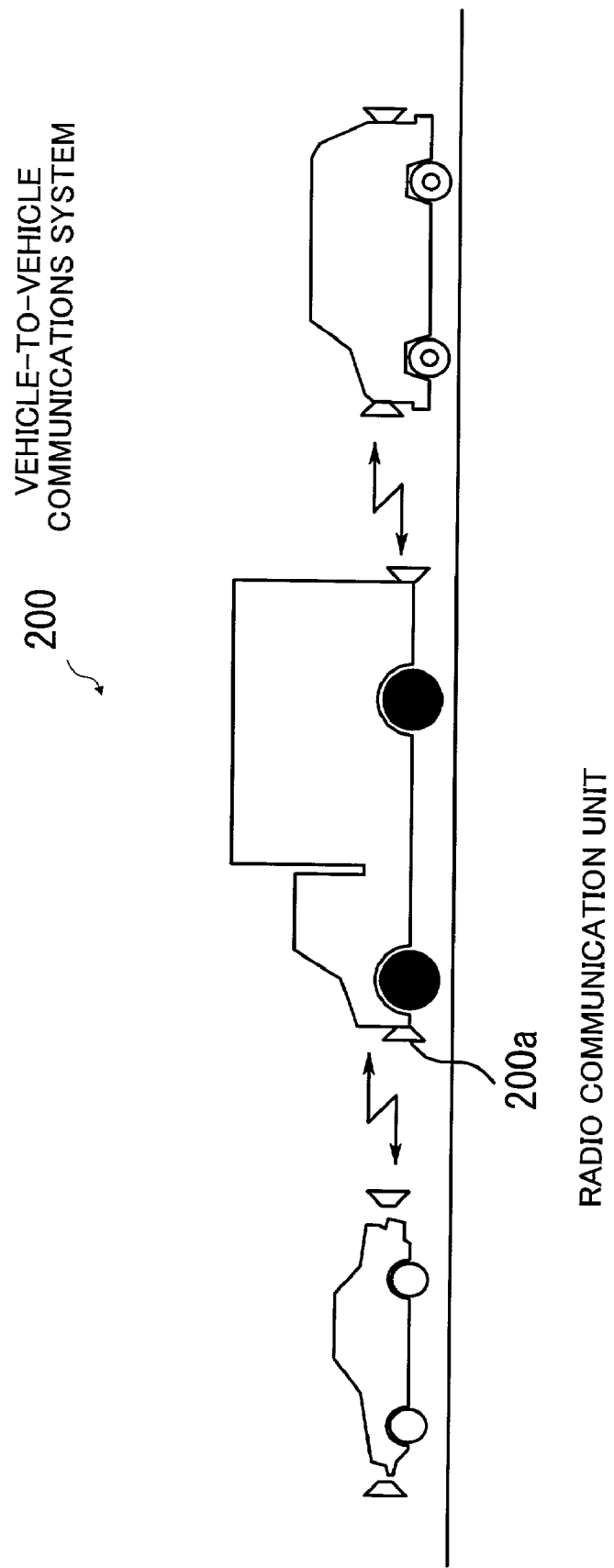
FIG. 16 shows another typical application of the present invention.
Figure 17:
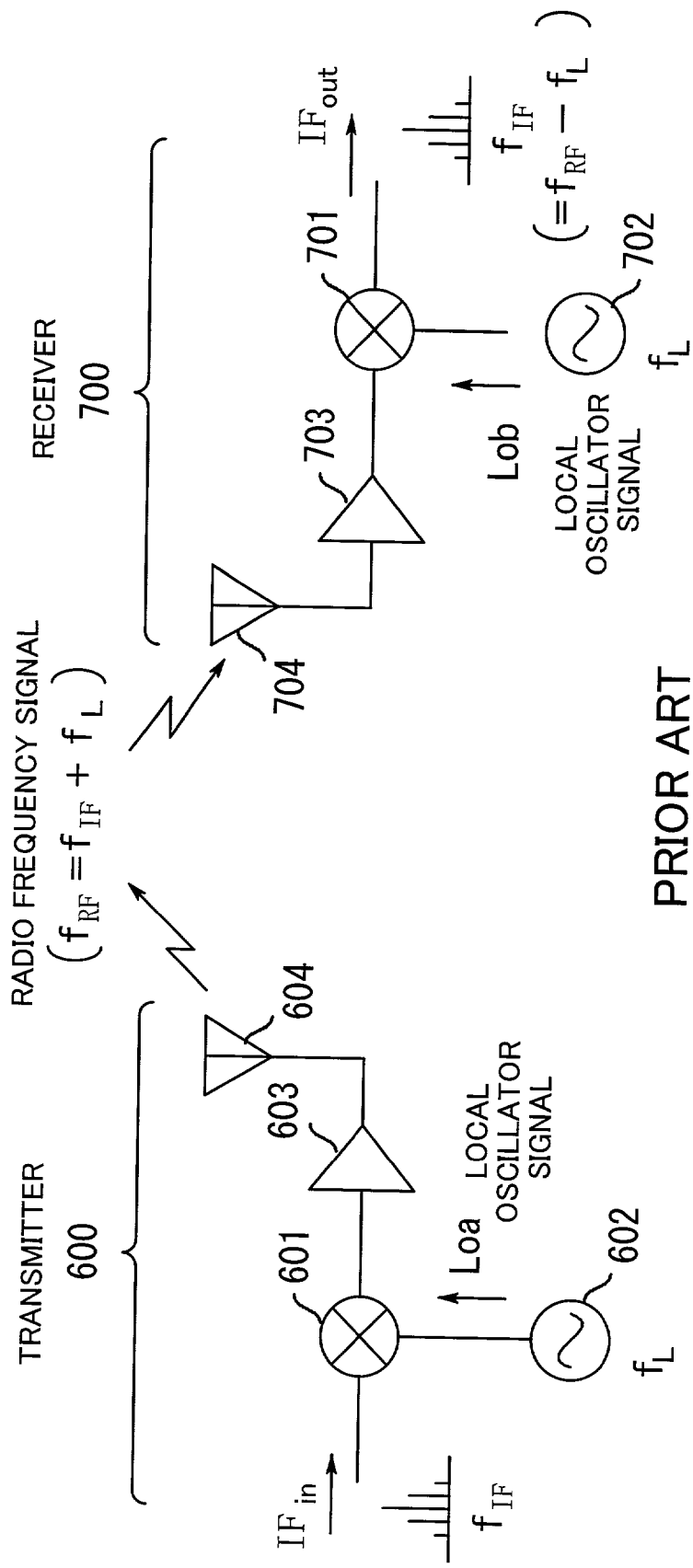
FIG. 17 shows a conventional radio communications system.

Referring to FIGS. 15 and 16, some possible applications of the present invention will be described below. FIG. 15 shows a wireless local area network (wireless LAN) system where the present invention is implemented. In this wireless LAN system 100, a wireless LAN card 107 is connected with the following devices: a server 104, a printer 105, a multi-function digital telephone 106, and an inter-building communication unit 108. Personal computers 101 to 103 are linked to the wireless LAN card 107 through wireless channels.

All those personal computers 101 to 103, wireless LAN card 107, and inter-building communication unit 108 are equipped with a transmitter 10 and receiver 20 of the present invention in order to provide millimeter wave communication service using 60 GHz radio bands. The wireless LAN card 107 is a network interface card that serves as a radio access point for the personal computers 101 to 103 to attach themselves to the LAN environment. The inter-building communication unit 108 is an outdoor wireless unit which provides a high-speed link to peer LANs located in remote places.

FIG. 16 shows a vehicle-to-vehicle communication system where the present invention is implemented. In this vehicle-to-vehicle communication system 200, each vehicle has two radio communications units 200*a*, one at the front end and the other at the rear end, each containing a transmitter 10 and receiver 20 of the present invention. The radio communications units 200*a* are used to control the vehicle to maintain a safe distance to other vehicles. It would also transmit an alert to surrounding vehicles in case of emergency.

As has been illustrated in FIGS. 15 and 16, the present invention can be applied to various millimeter wave communications systems. Such applications include high-speed wireless LANs for indoor use in both home and office environments. Another application is high-speed radio links for interconnecting remote facilities. The present invention also contributes to vehicle-to-vehicle communication systems which help people drive safely.

As has been described so far, the proposed transmitter 10, including its various variations, has a transmitter mixer for mixing an information-carrying signal (first signal) and a non-modulated wave signal (second signal) with a carrier signal, thereby producing radio frequency signals for radio wave transmission. The proposed receiver 20, including its various variations, has a receiver mixer which mixes those two received radio frequency signals to extract the original information signal therefrom. While the received radio frequency signals contain some frequency fluctuations as a result of oscillator instability at the sending end, such fluctuations will never affect the operation at the receiving end. The present invention thus enables highly accurate frequency control in radio communication, providing robustness against inevitable instability and phase noises of high-frequency local oscillators employed in the millimeter-band transmitters.

The present invention eliminates the need for a high-accuracy oscillator because the receiver does not have to mimic a local oscillator in the transmitting end. Actually, the validity of this advantage is not limited to particular frequencies, but the proposed techniques can also be applied to radio communication at any frequencies, including frequency ranges lower than the millimeter band.

Further, the present invention offers an improved frequency arrangement that is easy to manipulate because the local oscillator signal is distant from the allocated radio frequency slot. Unnecessary image signals and carrier signal can be removed effectively with an ordinary band-pass filter, as opposed to a large waveguide filter. Accordingly, the invention provides simple and low-cost solutions to serve the radio communication needs.

The present invention has been made to work around the technical difficulty of stabilized VCOs for use in the millimeter band. However, the proposed method is still meaningful to the systems having stable VCOs, because there can be no perfect match between two separate oscillators even if they are both stabilized with PLL techniques. Every transmitter shows its own fluctuations in the radio wave signals that it transmits, most of which are difficult to compensate at the receiving end. The present invention solves the problem by effectively canceling such fluctuations in the radio transmission signals.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A transmitter comprising:
   a mixer;
   said mixer receiving a first input signal being modulated with an information signal, a second input signal being a non-modulated wave signal and an input carrier signal; and
   said mixer producing a first radio frequency signal and a second radio frequency signal by mixing said first input signal and said second input signal with said input carrier signal and up-converting both of them into radio waves for transmitting by the transmitter.

2. The transmitter according to claim 1, wherein the second input signal is a sinusoidal wave signal.

3. The transmitter according to claim 1, wherein the second input signal is a square wave signal.

4. The transmitter according to claim 1, wherein the first input and second input signals are different in frequency.

5. The transmitter according to claim 1, wherein the first input and second input signals are substantially equal in frequency.

6. The transmitter according to claim 1, wherein: two or more instances of the first input signal, each having a different frequency, are given to the transmitter; and said mixer mixes the first input signal and the second input signal with the input carrier signal.

7. The transmitter according to claim 1, further comprising a filter which rejects unnecessary frequency components from mixing results of said mixer, thereby selectively outputting the first and second radio frequency signals.

8. The transmitter according to claim 7, wherein said mixer and said filter are integrated on a single semiconductor chip.

9. The transmitter according to claim 1, further comprising a transmitter amplifier which amplifies the produced first and second radio frequency signals.

10. The transmitter according to claim 9, wherein said mixer and said transmitter amplifier are integrated on a single semiconductor chip.

11. The transmitter according to claim 1, further comprising an antenna for radiating the first and second radio frequency signals.

12. The transmitter according to claim 11, wherein said mixer and said antenna are integrated into a single semiconductor device.

13. The transmitter according to claim 1, further comprising a transmitter local oscillator which generates the input carrier signal.

14. The transmitter according to claim 13, wherein said mixer and said transmitter local oscillator are integrated on a single semiconductor chip.

15. The transmitter according to claim 1, wherein the first input signal is produced by mixing the information signal with an intermediate frequency signal.

16. The transmitter according to claim 15, wherein said mixer receives the intermediate frequency signal as the second input signal.

17. The transmitter according to claim 15, further comprising an intermediate frequency oscillator that generates the intermediate frequency signal.

18. The transmitter according to claim 17, wherein said mixer and said intermediate frequency oscillator are integrated on a single semiconductor chip.

19. The transmitter according to claim 1, wherein frequency difference between the first input signal and second input signal is variable.

20. A transmitter comprising:
a mixer;
said mixer receiving a first input signal being a baseband signal, a second input signal being a non-modulated wave signal and an input carrier signal; and
said mixture producing a first radio frequency signal and a second radio frequency signal by mixing said first input signal and said second input signal with said input carrier signal and up-converting both of them into radio waves for transmitting.

21. A receiver comprising:
a receiver mixer which mixes a received first and second radio frequency signals to extract a difference frequency signal therefrom, the first and second radio frequency signals having been produced at a sending end by a transmitter having a mixer which receives a first input signal being modulated with an information signal, a second input signal being a non-modulated wave signal and an input carrier signal; and
said mixer producing the first and second radio frequency signals by mixing the first input signal and the second input signal with the input carrier signal and up-converting both of them into radio waves for transmitting by the transmitter.

22. The receiver according to claim 21, wherein the first input and second input signals are different in frequency.

23. The receiver according to claim 21, wherein the first input and second input signals are substantially equal in frequency.

24. The receiver according to claim 21, further comprising:
a preliminary amplifier placed before said receiver mixer, which is a variable gain amplifier for amplifying the received first and second radio frequency signals to intended levels; and a controller which controls mixing efficiency of said receiver mixer by varying the gain of said preliminary amplifier according to signal levels of the received first and second radio frequency signals.

25. The receiver according to claim 24, wherein said receiver mixer and said preliminary amplifier are integrated on a single semiconductor chip.

26. The receiver according to claim 21, further comprising:
a local second-signal oscillator which generates a local oscillator signal that has the same frequency as the input second signal; and
mixing means for mixing the extracted difference frequency signal with the local oscillator signal.

27. The receiver according to claim 26, wherein said receiver mixer functions as said mixing means.

28. The receiver according to claim 26, further comprising an adjusting mixer that functions as said mixing means.

29. The receiver according to claim 28, wherein said receiver mixer and said adjusting mixer are integrated on a single semiconductor chip.

30. The receiver according to claim 26, wherein said receiver mixer and said local second-signal oscillator are integrated on a single semiconductor chip.

31. The receiver according to claim 21, further comprising a receiver amplifier which amplifies the first and second radio frequency signals that are received.

32. The receiver according to claim 31, wherein said receiver mixer and said receiver amplifier are integrated on a single semiconductor chip.

33. The receiver according to claim 21, further comprising an antenna for receiving the first and second radio frequency signals.

34. The receiver according to claim 33, wherein said receiver mixer and said antenna are integrated into a single semiconductor device.

35. The receiver according to claim 21, further comprising a signal selector which extract a difference frequency signal from a particular set of first and second radio frequency signals having a specified frequency difference.

36. The receiver according to claim 35, wherein said receiver mixer and said signal selector are integrated on a single semiconductor chip.

37. A radio communications system, comprising:
a transmitter comprising a mixer, said mixer receiving a first input signal being modulated with an information signal, a second input signal being a non-modulated wave signal and an input carrier signal, and said mixer producing a first radio frequency signal and a second radio frequency signal by mixing said first input signal and said second input signal with said input carrier signal and up-converting both of them into radio waves for transmitting by the transmitter; and
a receiver comprising a receiver mixer which extracts a difference frequency signal from the first and second radio frequency signals by mixing the first and second radio frequency signals that are received from said transmitter.

38. The radio communications system according to claim 37, wherein the first input and second input signals are different in frequency.

39. The radio communications system according to claim 37, wherein the first input and second input signals are substantially equal in frequency.

40. The radio communications system according to claim 37, wherein the second input signal is a sinusoidal wave signal.

41. The radio communications system according to claim 37, wherein the second input signal is a square wave signal.

42. The radio communications system according to claim 37, wherein:
two or more instances of the first input signal, each having a different frequency, are given to said transmitter; and
said mixer mixes the first input signal and the second input signal with the input carrier signal.

43. The radio communications system according to claim 37, wherein the transmitter varies frequency difference between the first input signal and second input signal.

44. The radio communications system according to claim 37, further comprising a signal selector which extracts a difference frequency signal from a particular set of first and second radio frequency signals having a specified frequency difference.

45. A method of sending information from a transmitting end to a receiving end through a radio communication channel, comprising the steps of:
(a) at the transmitting end, sending out a first and second radio frequency signals which are produced by mixing a first input and second input signals inputted to a mixer with a input carrier signal inputted to the mixer and up-converting both of them into radio waves, the first input signal being modulated with an information signal, the second input signal being a non-modulated wave signal; and
(b) at the receiving end, extracting a difference frequency signal from the first and second radio frequency signals by mixing the first and second radio frequency signals that are received from the transmitting end.

46. The radio communication method according to claim 45, wherein the first input and second input signals are different in frequency.

47. The radio communication method according to claim 45, wherein the first input and second input signals are substantially equal in frequency.

48. The radio communication method according to claim 45, wherein the second input signal is a sinusoidal wave signal.

49. The radio communication method according to claim 45, wherein the second input signal is a square wave signal.

50. The radio communication method according to claim 45, wherein:
two or more instances of the first input signal, each having a different frequency, are available at the transmitting end; and
said sending step (a) mixes the first input signal and the second input signal with the input carrier signal.

51. The radio communication method according to claim 45, wherein frequency difference between the first input signal and second input signal is variable.

52. The radio communication method according to claim 45, wherein said extracting step (b) extracts a difference frequency signal from a particular set of first and second radio frequency signals having a specified frequency difference.

53. A method of sending information, comprising the step of:
transmitting a first and second radio frequency signals which are produced by mixing a first input and second input signals received in a mixer with a input carrier signal received in the mixer and up-converting both of them into radio waves, the first input signal being modulated with an information signal, the second input signal being a non-modulated wave signal.

54. The method according to claim 53, wherein the second input signal is a sinusoidal wave signal.

55. The method according to claim 53, wherein the second input signal is a square wave signal.

56. The method according to claim 53, wherein:
two or more instances of the first input signal, each having a different frequency, are available for transmission; and
said transmitting step mixes the first input and the second input signal with the input carrier signal.

57. The method according to claim 53, wherein frequency difference between the first input signal and second input signal is variable.

58. A method of receiving information, comprising the step of mixing a received first and second radio frequency signals to extract a difference frequency signal therefrom, the first and second radio frequency signals having been produced at a sending end by mixing a first input signal and a second input signal received in a mixer with a input carrier signal received in the mixer and up-converting both of them into radio waves, the first input signal being modulated with an information signal, the second input signal being a non-modulated wave signal.

59. The method according to claim 58, wherein said mixing step extracts the difference frequency signal from a particular set of first and second radio frequency signals having a specified frequency difference.

* * * * *